(12) United States Patent
Pu et al.

(10) Patent No.: US 12,291,772 B2
(45) Date of Patent: May 6, 2025

(54) LOW-FRICTION LONG-LIFE ULTRA-LATTICE COMPOSITE COATING AS WELL AS PREPARATION METHOD AND USE THEREOF

(71) Applicant: NINGBO INSTITUTE OF MATERIALS TECHNOLOGY AND ENGINEERING, CHINESE ACADEMY OF SCIENCES, Ningbo (CN)

(72) Inventors: Jibin Pu, Ningbo (CN); Yanbin Shi, Ningbo (CN); Haixin Wang, Ningbo (CN)

(73) Assignee: NINGBO INSTITUTE OF MATERIALS TECHNOLOGY AND ENGINEERING, CHINESE ACADEMY OF SCIENCES, Ningbo (CN)

( * ) Notice: Subject to any disclaimer, the term of this patent is extended or adjusted under 35 U.S.C. 154(b) by 0 days.

(21) Appl. No.: 18/833,935

(22) PCT Filed: Dec. 11, 2023

(86) PCT No.: PCT/CN2023/137948
§ 371 (c)(1),
(2) Date: Jul. 29, 2024

(87) PCT Pub. No.: WO2024/244380
PCT Pub. Date: Dec. 5, 2024

(65) Prior Publication Data
US 2025/0109485 A1    Apr. 3, 2025

(30) Foreign Application Priority Data
May 29, 2023 (CN) .......................... 202310611417.0

(51) Int. Cl.
*C23C 14/35* (2006.01)
*C23C 14/02* (2006.01)
*C23C 14/06* (2006.01)

(52) U.S. Cl.
CPC ............ *C23C 14/35* (2013.01); *C23C 14/022* (2013.01); *C23C 14/0623* (2013.01); *C23C 14/0641* (2013.01)

(58) Field of Classification Search
CPC ... C23C 14/35; C23C 14/022; C23C 14/0623; C23C 14/0641
See application file for complete search history.

(56) References Cited

U.S. PATENT DOCUMENTS

2006/0234081 A1* 10/2006 Inoue .................... C23C 14/027
                                                              428/689
2015/0111370 A1     4/2015 Wang
(Continued)

FOREIGN PATENT DOCUMENTS

CN    101270465 A    9/2008
CN    101698362 A    4/2010
(Continued)

OTHER PUBLICATIONS

Ren, et al., Environmentally adaptive lubrication enabled by gradient structure design of TiN—MoS2/Ti, Apr. 2023, Surface and Coatings Technology, vol. 458, 129317 (Year: 2023).*
(Continued)

*Primary Examiner* — James Lin
*Assistant Examiner* — Patrick S Ott
(74) *Attorney, Agent, or Firm* — Bayramoglu Law Offices LLC

(57) ABSTRACT

A low-friction long-life ultra-lattice composite coating as well as a preparation method and use thereof are provided. The ultra-lattice composite coating includes a titanium tran-
(Continued)

sition layer, a $TiN_x$ bearing layer, a $TiN_x/MoS_2$ gradient transition layer, a $MoS_2/Me$ gradient transition layer and a $MoS_2/Me$ ultra-lattice layer which are successively formed on the surface of a matrix; wherein, in a direction gradually far away from the matrix, the content of $MoS_2$ in the $TiN_x/MoS_2$ gradient transition layer is increasing, and the content of $MoS_2$ in the $MoS_2/Me$ gradient transition layer is decreasing. The ultra-lattice composite coating has excellent mechanical property and tribological performance, with a vacuum friction coefficient being below 0.02 and a friction life exceeding $4\times10^6$ revolutions, which can meet the requirements on ultra-low friction and ultra-long service life for aerospace vehicles. Meanwhile, the preparation method is simple, stable and effective, and has prominent practical values and economic benefits.

20 Claims, 4 Drawing Sheets

(56) References Cited

U.S. PATENT DOCUMENTS

| | | |
|---|---|---|
| 2018/0372151 A1 | 12/2018 | Sridhar et al. |
| 2022/0341023 A1 | 10/2022 | Wang et al. |

FOREIGN PATENT DOCUMENTS

| | | |
|---|---|---|
| CN | 111172498 A | 5/2020 |
| CN | 114318270 A | 4/2022 |
| CN | 115287592 A | 11/2022 |
| CN | 115404443 A | 11/2022 |
| CN | 116254505 A | 6/2023 |
| CN | 116497457 A | 7/2023 |
| DE | 10119926 A1 | 10/2002 |
| JP | 2006193803 A | 7/2006 |
| WO | 9704142 A1 | 2/1997 |
| WO | 9955930 A1 | 11/1999 |

OTHER PUBLICATIONS

Yanbin Shi, et al., Robust macroscale superlubricity enabled by tribo-induced structure evolution of MoS2/metal superlattice coating, Composites Part B, 2023, pp. 1-9, vol. 250, 110460.

Ju Pengfei, et al., Impact of Ti-Doping on Tribological Properties of MoS2 Coatings on Spacecraft Component, Chinese Journal of Vacuum Science and Technology, 2018, pp. 901-905, vol. 38 No. 10.

Wang Li-Jie, et al., The Study on Tribological Properties of MoS2 / TiN Composite Coating on the Surface of Titanium Alloy, Surface Technology, 2010, pp. 11-13, vol. 39 No. 2.

Ju Yi, et al., Research Development of the TIN Multilayer Coatings, Journal of Zhejiang Sci-Tech University, 2005, pp. 345-349, vol. 22 No. 4.

Xiong Xuehui, et al., Tribological Property of MoS2 / Ti Composite Coatings, Chinese Journal of Vacuum Science and Technology, 2011, pp. 174-177, vol. 31 No. 2.

Jia Dongxu, et al., Effect of Different Transition Layer Structures on Cr-DLC Coating Properties, Vacuum and Cryogenics, 2023, pp. 137-145, vol. 29 No. 2.

* cited by examiner

LOW-FRICTION LONG-LIFE ULTRA-LATTICE COMPOSITE COATING AS WELL AS PREPARATION METHOD AND USE THEREOF

CROSS REFERENCE TO THE RELATED APPLICATIONS

This application is the national phase entry of International Application No. PCT/CN2023/137948, filed on Dec. 11, 2023, which is based upon and claims priority to Chinese Patent Application No. 202310611417.0, filed on May 29, 2023, the entire contents of which are incorporated herein by reference.

TECHNICAL FIELD

The present application belongs to the technical field of solid lubrication coatings on the surfaces of spatial mechanisms, and particularly relates to a low-friction long-life ultra-lattice composite coating as well as a preparation method and use thereof.

BACKGROUND

A spatial mechanism metal friction pair has the problems of serious cold welding and high friction and wear in a high-vacuum environment, and a solid lubrication coating is a key material preventing the cold welding of the spatial mechanism friction pair, providing lubrication and prolonging the service life of the spatial mechanism metal friction pair. Studies show that the failure of moving components of a considerable proportion of spacecrafts is related to space lubrication, and the premature failure of the space lubrication coating may bring extremely serious impact to the spatial mechanism and even leads to the paralysis of an entire system. Therefore, to ensure that the spatial mechanism achieves its functions and realizes high-reliability ultra-long service life, high-performance space solid lubrication is one of essential key technologies. At present, the widely used material is a molybdenum disulfide coating material. Thanks to weak van der Waals bonding between layers, it is easy to slide between layers, so as to exhibit good lubrication performance. However, with the development of long-life low-orbit spacecrafts and deep space probes, the existing molybdenum disulfide-based solid lubrication coating will not guarantee the high-reliable and long-life working of the spatial mechanism.

So far, various types of molybdenum disulfide coatings have been prepared through different preparation technologies at home and abroad, however, process technologies and methods significantly affect its performance. Unbalanced magnetron sputtering is a green low-temperature deposition technology capable of precisely controlling the components, structure and thickness of the coating through process parameters, a molybdenum disulfide coating with high density and binding force can be obtained by designing magnetic field distribution and transition layer matching, and therefore the unbalanced magnetron sputtering has become a main preparation technology for solid lubrication coatings of friction pairs of key spatial mechanisms. However, the traditional sputtering molybdenum disulfide coating is generally (001) crystal oriented or non-crystal structure, with a low coating hardness and poor bearing capability. Furthermore, its columnar structure is easily eroded by water and oxygen in moist air in the processes of transport, storage and the like, so that the coating is deteriorated in lubrication performance and failed in oxidation. Therefore, how to obtain a novel molybdenum disulfide coating with high hardness, high bearing, ultra-low friction and ultra-long life is an important problem urgently solved by a new-generation long-life spatial mechanism.

SUMMARY

The main objective of the present application is to provide a low-friction long-life ultra-lattice composite coating as well as a preparation method and use thereof, in order to overcome the defects in the prior art.

To realize the above-mentioned objective, the technical solution adopted by the present application is as follows:

The embodiment of the present application provides a low-friction long-life ultra-lattice composite coating, comprising: a titanium transition layer, a $TiN_x$ bearing layer, a $TiN_x/MoS_2$ gradient transition layer, a $MoS_2$/Me gradient transition layer and a $MoS_2$/Me ultra-lattice layer which are successively formed on the surface of a matrix;

wherein, x is 0.5-1, Me comprises a combination of any one or more than two of Ti, Zr, V, Nb, Cr, Mo and Cd; furthermore, in a direction gradually far away from the matrix, the content of $MoS_2$ in the $TiN_x/MoS_2$ gradient transition layer is increasing, and the content of $MoS_2$ in the $MoS_2$/Me gradient transition layer is decreasing; the $MoS_2$/Me ultra-lattice layer comprises alternately stacked $MoS_2$ layer and Me layer; the $MoS_2$ layer in the $MoS_2$/Me ultra-lattice layer is oriented and grows parallel to a $MoS_2$ (002) plane.

The embodiment of the present application further provides a preparation method of the above-mentioned low-friction long-life ultra-lattice composite coating, comprising: successively depositing a titanium transition layer, a $TiN_x$ bearing layer, a $TiN_x/MoS_2$ gradient transition layer, a $MoS_2$/Me gradient transition layer and a $MoS_2$/Me ultra-lattice layer on the surface of a matrix by using an unbalanced magnetron sputtering technology to obtain the low-friction long-life ultra-lattice composite coating.

The embodiment of the present application further provides use of the above-mentioned low-friction long-life ultra-lattice composite coating in the surface protection field of spatial mechanisms.

Compared with the prior art, the present application has the beneficial effects:

(1) The $TiN_x$ bearing layer and the $TiN_x/MoS_2$ gradient transition layer are prepared through Ti and $N_2$ plasma reaction and by using the unbalanced magnetron sputtering technology for Ar and $N_2$ reactive sputtering, and the provided coating has excellent mechanical properties such as strong binding (greater than 15 N) and high hardness (greater than 7 GPa), can adapt to surface prevention of parts in high-impact environments and can greatly improve the abrasive resistance of the coating so as to facilitate the prolongation of the service life of the spatial mechanism.

(2) The $MoS_2$/Me ultra-lattice coating is prepared through alternating deposition design of non-crystal metal phase and molybdenum disulfide by using the unbalanced magnetron sputtering technology for multi-target alternating deposition, the provided coating has the feature of preferential orientation of a molybdenum disulfide (0002) crystal surface, the friction coefficient and wear rate of the coating can be greatly reduced, the friction coefficient in the vacuum environment is as low as 0.005-0.02, the friction life exceeds $4 \times 10^6$ revolutions, which facilitates the improvement of efficiency, reliability and service life of the spatial mechanism.

BRIEF DESCRIPTION OF THE DRAWINGS

For more clearly explaining the embodiments of the present application or the technical solution in the prior art, accompanying drawings required for the description of embodiments or the prior art will be simply and obviously introduced below. Apparently, the drawings used in the following description are only some embodiments recorded in the present application. Persons of ordinary skill in the art can also obtain other drawings according to these drawings without contributing creative efforts.

DETAILED DESCRIPTION OF THE EMBODIMENTS

In view of the defects in the prior art, the inventor of this case proposes the technical solution of the present application via long-term researches and lots of practices, the binding mode and binding form between the coating and the matrix and other physical properties are crucial to the binding strength, mechanical properties and frictional performance of the coating, especially the wear resistance of the coating. The coating is applied between a $MoS_2$/Me lubrication coating and the matrix through a titanium transition layer, a $TiN_x$ bearing layer and a $TiN_x$/$MoS_2$ gradient transition layer, which has significant influence on the binding force, bearing resistance and mechanical properties of the coating. An interface which is introduced in an ultra-lattice structure can promote the parallel oriented growth of the $MoS_2$ plane (002), further improves the structural density of the coating and boots the mechanical property and tribological performance of the coating.

Next, the technical solution of the present application will be clearly and completely described, obviously, the described embodiments are some embodiments of the present application, but not all the embodiments. Based on the embodiments of the present application, other embodiments obtained by persons of ordinary skill in the art without contributing creative efforts are all included in the scope of protection of the present application.

Specifically, as one aspect of the technical solution of the present application, an involved low-friction long-life ultra-lattice composite coating comprises: a titanium transition layer, a $TiN_x$ bearing layer, a $TiN_x$/$MoS_2$ gradient transition layer, a $MoS_2$/Me gradient transition layer and a $MoS_2$/Me ultra-lattice layer which are successively formed on the surface of a matrix;

wherein, x is 0.5-1, Me comprises a combination of any one or more than two of Ti, Zr, V, Nb, Cr, Mo and Cd; furthermore, in a direction gradually far away from the matrix, the content of $MoS_2$ in the $TiN_x$/$MoS_2$ gradient transition layer is increasing, and the content of $MoS_2$ in the $MoS_2$/Me gradient transition layer is decreasing; the $MoS_2$/Me ultra-lattice layer comprises alternately stacked $MoS_2$ layer and Me layer; the $MoS_2$ layer in the $MoS_2$/Me ultra-lattice layer is oriented and grows parallel to a $MoS_2$ (002) plane.

Figure 6:
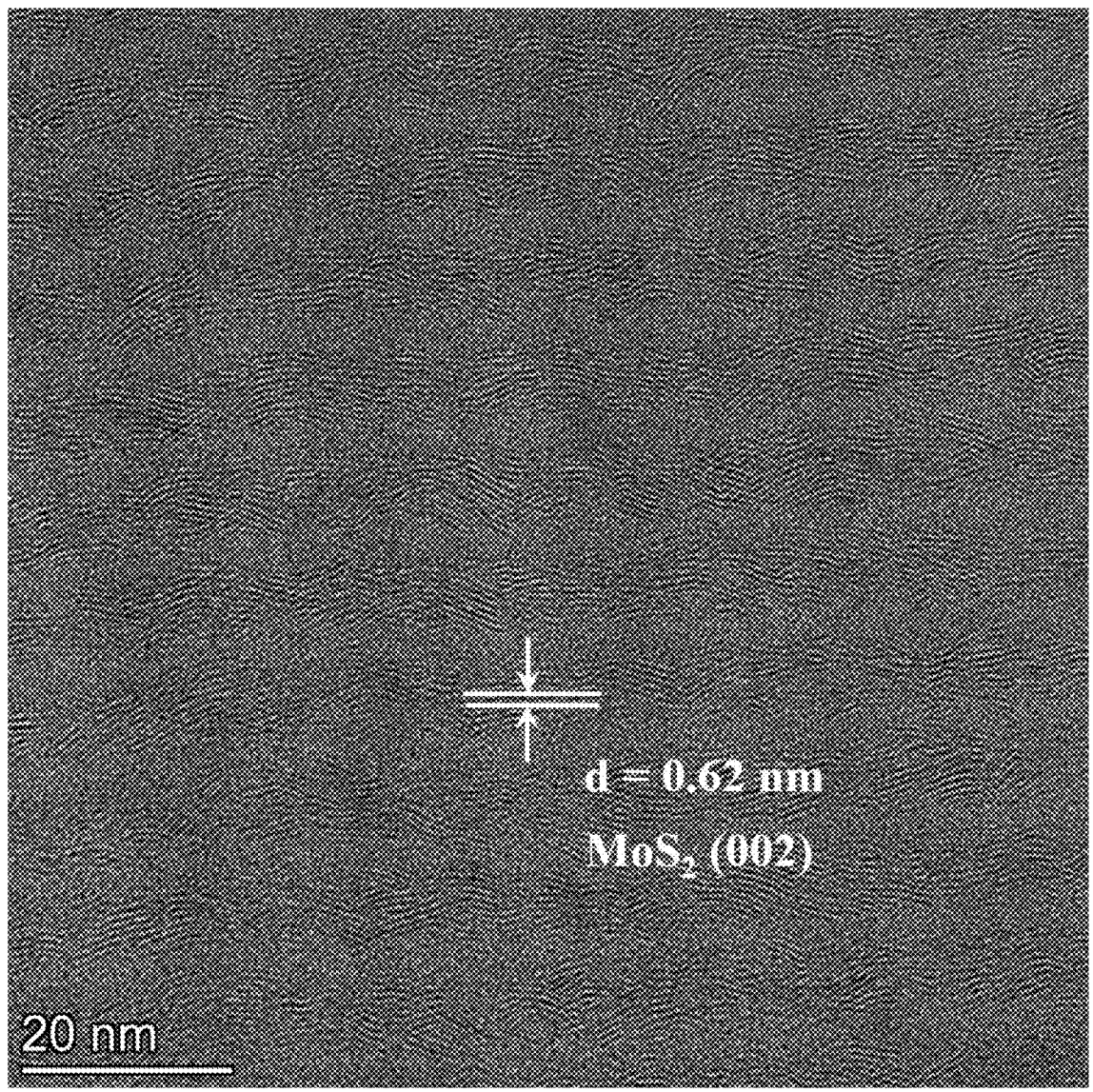
FIG. 6 is a transmission electron microscopy image of a $MoS_2$ layer in a $MoS_2$/Me ultra-lattice layer orienting and growing parallel to a $MoS_2$ (002) plane prepared in a typical embodiment according to the present application.

In the traditional $MoS_2$ sputtering process, high-energy plasmas can cause deposited $MoS_2$ to have defects during the PVD sputtering, so that $MoS_2$ preferably grows in a (100) plane direction, wherein, a distance between crystal faces growing in (100) plane is 0.31 nm. However, an alternating deposition mode of a $MoS_2$ layer and a Me layer is used in the present application, so that the $MoS_2$ layer is oriented and grows parallel to the $MoS_2$ (002) plane based on interaction between $MoS_2$ and a metal interface; specifically, the transition electron microscopy image of the $MoS_2$ layer in the $MoS_2$/Me ultra-lattice layer prepared in the present application, which is oriented and grows parallel to $MoS_2$ (002) plane, can refer to FIG. 6. It can be seen from FIG. 6 that a distance between crystal faces of molybdenum disulfide is 0.62 nm, indicating that the $MoS_2$ layer is oriented and grows parallel to the $MoS_2$ (002) plane.

In some preferred embodiments, the hardness of the ultra-lattice composite coating is more than 7 GPa.

In some preferred embodiments, a binding force between the low-friction long-life ultra-lattice composite coating and the matrix is more than 15 N, and the material of the matrix is selected from 316L stainless steel, a TC4 titanium alloy or a monocrystalline silicon wafer, and is not limited thereto.

In some preferred embodiments, the friction coefficient of the ultra-lattice composite coating in a vacuum environment is less than 0.02, and the wear life of the ultra-lattice composite coating is more than $4 \times 10^6$ revolutions.

Further, the friction coefficient of the ultra-lattice composite coating in a vacuum environment is 0.005-0.02.

In some preferred embodiments, the thickness of the ultra-lattice composite coating is 2.0 μm-3.0 μm.

In some preferred embodiments, the thickness of the titanium transition layer is 50 nm-150 nm.

In some preferred embodiments, the thickness of the $TiN_x$ bearing layer is 150 nm-300 nm.

In some preferred embodiments, the thickness of the $TiN_x$/$MoS_2$ gradient transition layer is 50 nm-150 nm.

In some preferred embodiments, the thickness of the $MoS_2$/Me gradient transition layer is 100 nm-300 nm.

In some preferred embodiments, the thickness of the $MoS_2$/Me ultra-lattice layer is 1.5 μm-2.5 μm.

In some preferred embodiments, a $MoS_2$-to-Me modulation ratio $t_{MoS2}:t_{Me}$ in the $MoS_2$/Me ultra-lattice layer is 5:1-2:1.

In some preferred embodiments, the modulation period of the $MoS_2$/Me ultra-lattice layer is Λ=4 nm-20 nm.

In some preferred embodiments, the content of metal atoms in the $MoS_2$/Me ultra-lattice layer is 5 at %-15 at %.

In some preferred embodiments, the $MoS_2$/Me ultra-lattice layer comprises a plurality of alternately superposed periodic layers, and each alternately superposed periodic layer comprises one $MoS_2$ layer and one Me layer.

Another aspect of the embodiments of the present application also provides a preparation method of the above-mentioned low-friction long-life ultra-lattice composite coating, comprising: successively depositing a titanium transition layer, a $TiN_x$ bearing layer, a $TiN_x/MoS_2$ gradient transition layer, a $MoS_2/Me$ gradient transition layer and a $MoS_2/Me$ ultra-lattice layer on the surface of a matrix by using an unbalanced magnetron sputtering technology to obtain the low-friction long-life ultra-lattice composite coating.

In some preferred embodiments, the preparation method comprises: by using an unbalanced magnetron sputtering technology based on a titanium target as a negative electrode target and an inert gas as a working gas, applying a sputtering current to the titanium target, and applying a back bias voltage to the matrix, thereby depositing a titanium transition layer on the surface of the matrix, wherein the sputtering current is 3.0 A-5.0 A, the bias voltage of the matrix is −100 V to −150 V, the flow of the working gas is 20 sccm-30 sccm, the temperature of the matrix is 50° C.-150° C., the pressure of a reaction cavity is 0.1 Pa-2.0 Pa, and the deposition time is 300 s-900 s.

Further, the inert gas is argon, and is not limited thereto.

In some preferred embodiments, the preparation method specifically comprises: by using an unbalanced magnetron sputtering technology based on a titanium target as a negative electrode target and an inert gas and $N_2$ as working gases, applying a sputtering current to the titanium target, and applying a back bias voltage to the matrix, thereby depositing a $TiN_x$ bearing layer on the surface of the titanium transition layer, wherein the sputtering current is 3.0 A-5.0 A, the bias voltage of the matrix is −100 V to −150 V, the flow of the inert gas is 20 sccm-30 sccm, the flow of the $N_2$ gas is 5 sccm-15 sccm, the temperature of the matrix is 50° C.-150° C., the pressure of a reaction cavity is 0.1 Pa-2.0 Pa, and the deposition time is 2400 s-4800 s.

Further, the inert gas is argon, and is not limited thereto.

In some preferred embodiments, the preparation method specifically comprises: applying a sputtering current to a titanium target and a molybdenum disulfide target by using an unbalanced magnetron sputtering technology based on the titanium target and the molybdenum disulfide target as negative electrode targets and an inert gas and $N_2$ as working gases, and applying a back bias voltage to a matrix, thereby depositing a $TiN_x/MoS_2$ gradient transition layer on the surface of the $TiN_x$ bearing layer, wherein the sputtering current applied to the titanium target gradually decreases from 3.0 A-5.0 A to 0, the sputtering current applied to the molybdenum disulfide target gradually increases from 0 to 1.2 A-2.0 A, the bias voltage of the matrix is −30 V to −70 V, the flow of the inert gas is 10 sccm-20 sccm, the flow of the $N_2$ gas is 5 sccm-15 sccm, the temperature of the matrix is 50° C.-150° C., the pressure of a reaction cavity is 0.1 Pa-2.0 Pa, and the deposition time is 300 s-900 s.

Further, the inert gas is argon, and is not limited thereto.

In some preferred embodiments, the preparation method specifically comprises: by using an unbalanced magnetron sputtering technology based on the metal Me target and the molybdenum disulfide target as negative electrode targets and an inert gas as a working gas, applying a sputtering current to a metal Me target and a molybdenum disulfide target, and applying a back bias voltage to a matrix, thereby depositing a $MoS_2/Me$ gradient transition layer on the surface of the $TiN_x/MoS_2$ gradient transition layer, wherein the sputtering current applied to the metal Me target gradually increases from 0 to 0.6 A-1.4 A, the sputtering current applied to the molybdenum disulfide target is 1.2 A-2.0 A, the bias voltage of the matrix is −30 V to −70 V, the flow of the inert gas is 10 sccm-20 sccm, the temperature of the matrix is 50° C.-150° C., the pressure of a reaction cavity is 0.1 Pa-2.0 Pa, and the deposition time is 300 s-900 s; the material of the metal Me target is selected from any one of Ti, Zr, V, Nb, Cr, Mo, Zn and Cd.

Further, the inert gas is argon, and is not limited thereto.

In some preferred embodiments, the preparation method specifically comprises: applying a sputtering current to a molybdenum disulfide target and a metal Me target by using an unbalanced magnetron sputtering technology based on the molybdenum disulfide target and the metal Me target as negative electrode targets and an inert gas as a working gas, applying a back bias voltage to a matrix, applying the sputtering current to the molybdenum disulfide target and the metal Me target, and alternately depositing a $MoS_2$ layer and a Me layer, thereby depositing a $MoS_2/Me$ ultra-lattice layer on the surface of the $MoS_2/Me$ gradient transition layer, so as to obtain the ultra-lattice composite coating, wherein the sputtering current applied to the molybdenum disulfide target is 1.2 A-2.0 A, the sputtering current applied to the metal Me target is 0.6 A-1.4 A, the bias voltage of the matrix is −30 V to −70 V, the flow of the inert gas is 10 sccm-20 sccm, the temperature of the matrix is 50° C.-150° C., the pressure of a reaction cavity is 0.1 Pa-2.0 Pa, and the deposition time is 6000 s-8000 s; the deposition time for alternately depositing the MoS2 layer and the Me layer in each period is 10 s-90 s.

Further, the inert gas is argon, and is not limited thereto.

In some preferred embodiments, the preparation method also comprises: vacuumizing the reaction cavity until the vacuum degree is less than $3.0 \times 10^5$ torr, and first performing plasma etching on the washed matrix.

Further, the plasma etching comprises: the bias voltage applied to the matrix is −400 V to −500 V, the temperature of the matrix is 50° C.-150° C., and the etching time is 1200 s-2400 s.

In some preferred embodiments, the material of the matrix comprises 316L stainless steel, a TC4 titanium alloy or a monocrystalline silicon wafer, and is not limited thereto.

In some preferred embodiments, the matrix comprises a spatial mechanism.

In some more specific embodiments, the preparation method of the low-friction long-life ultra-lattice composite coating comprises:

by using an unbalanced magnetron sputtering technology based on the titanium target as a negative electrode target and Ar as a working gas, applying a sputtering current to a titanium target, and applying a back bias voltage to the matrix, thereby depositing a titanium transition layer on the surface of the matrix, wherein the sputtering current is 3.0 A-5.0 A, the bias voltage of the matrix is −100 V to −150 V, the flow of the working gas is 20 sccm-30 sccm, the temperature of the matrix is 50° C.-150° C., the pressure of the reaction cavity is 0.1 Pa-2.0 Pa, and the deposition time is 300 s-900 s; applying a sputtering current to a titanium target by using the unbalanced magnetron sputtering technology based on the titanium target as a negative electrode target and Ar and $N_2$ as working gases, and applying a back bias voltage to a matrix, thereby depositing a $TiN_x$ bearing layer on the surface of the matrix, wherein the sputtering current is 3.0 A-5.0 A, the flow of the working gas Ar is 20 sccm-30 sccm, the flow of the $N_2$ is 5 sccm-15 sccm, the temperature of the matrix is 50° C.-150° C., the pressure of a reaction cavity is 0.1 Pa-2.0 Pa, and the deposition time is 2400 s-4800 s; by using the unbalanced magnetron sputtering technology based on the titanium target and the molybdenum disulfide target as negative electrode targets and Ar and $N_2$ as a working gas, applying the sputtering current to the titanium target and the molybdenum disulfide target, applying the back bias voltage to the matrix, thereby depositing a $TiN_x/MoS_2$ gradient transition layer on the surface of the $TiN_x$ bearing layer, wherein the sputtering current applied to the titanium target decreases gradually from 3.0 A-5.0 A to 0, the sputtering current applied to the molybdenum disulfide target increases gradually from 0 to 1.2 A-2.0 A, the bias voltage of the matrix is −30 V to 70 V, the flow of the working gas Ar is 10 sccm-20 sccm, the flow of $N_2$ decreases gradually from 5 sccm-15 sccm to 0, the temperature of the matrix is 50° C.-150° C., the pressure of the reaction cavity is 0.1 Pa-2.0 Pa, and the deposition time is 300 s-900 s; by using the unbalanced magnetron sputtering technology based on the molybdenum disulfide target and the metal target as negative electrode targets and inert gas Ar as a working gas, applying the back bias voltage to the matrix, meanwhile applying the sputtering current to the molybdenum disulfide target and the metal target, thereby depositing a $MoS_2/Me$ gradient transition layer on the surface of the $TiN_x/MoS_2$ gradient transition layer, wherein the sputtering current applied to the molybdenum disulfide target is 1.2 A-2.0 A, the sputtering current applied to the metal target increases gradually from 0 to 0.6 A-1.4 A, the bias voltage of the matrix is −30 V to 70 V, the flow of the working gas Ar is 10 sccm-20 sccm, the temperature of the matrix is 50° C.-150° C., the pressure of the reaction cavity is 0.1 Pa-2.0 Pa, and the deposition time is 300 s-900 s; by using the unbalanced magnetron sputtering technology based on the molybdenum disulfide target and the metal target as negative electrode targets and inert gas Ar as a working gas, applying the back bias voltage to the matrix, applying the sputtering current to the molybdenum disulfide target and the metal target and precisely controlling the sputtering time of each target through a program, thereby depositing a $MoS_2/Me$ ultra-lattice layer on the gradient transition layer, wherein the sputtering current applied to the molybdenum disulfide target is 1.2 A-2.0 A, the sputtering current applied to the metal target is 0.6 A to 1.4 A, the bias voltage of the matrix is −30 V to −70 V, the flow of the working gas Ar is 10 sccm-20 sccm, the temperature of the matrix is 50° C.-150° C., the pressure of the reaction cavity is 0.1 Pa-2.0 Pa, and the deposition time is 6000 s-8000 s; the $TiN_x$—$MoS_2/Me$ ultra-lattice composite coating (the above-mentioned "ultra-lattice composite coating") comprises a titanium transition layer, a TiNx bearing layer, a $TiN_x/MoS_2$ gradient transition layer, a $MoS_2/Me$ gradient transition layer and a $MoS_2/Me$ ultra-lattice layer which are successively stacked in the thickness direction.

Another aspect of the embodiments of the present application also provides use of the above-mentioned low-friction long-life ultra-lattice composite coating in the surface protection field of spatial mechanisms.

The inventor of this case performs performance test on the above-mentioned ultra-lattice composite coating as follows:

The thickness of the coating is tested by using a scanning electron microscope. It can be seen from test results that the thickness of the coating is 2.0 μm-3.0 μm.

The hardness and elastic modulus of the coating are measured by using MTS NanoIndenterG200 nanoindentation system, with a diamond indenter and a depth of 1/10 of the film thickness at 200 nm. The average value is taken at six points. The test results are as follows: the nano hardnesses of the $TiN_x$—$MoS_2/Me$ ultra-lattice composite coatings of the present application are all greater than 7 GPa.

Binding force test: the binding force of the coating is tested by using an automatic scratch testing machine, which is operated according to the procedures of the automatic scratch testing machine. 3 scratch testes are conducted at different positions. The experimental conditions are as follows: the loading velocity is 5 N/min-10 N/min, the scratch length is 5 mm, and the loading force is 20 N. The test results are as follows: the binding force of the ultra-lattice composite coating of the present application is greater than 15 N.

Friction and wear test: tribological performance analysis is conducted in a vacuum environment by using a CSM friction test machine. 9Cr18 steel balls are used as counterparts, a reciprocating sliding mode is adopted, the frequency is 5 Hz, the track length is 5 mm, the running distance is 720 m, and the normal loading is 5 N. The worn cross section is measured by laser confocal, which multiplies by a running step to obtain a wear volume. The wear volume is divided by a load and a stroke to obtain a wear rate. The test results of friction coefficient and wear rate are as shown in Table 2.

Friction life test: tribological performance analysis is conducted in a vacuum environment by using a CSM friction test machine. 9Cr18 steel balls are used as counterparts, a rotation mode is adopted, the number of revolutions is 1000 rpm, the track radius is 8 mm, and the normal loading is 5 N. The test results show that during the entire friction test, all the friction coefficients are less than 0.02, and the friction life can be up to 4.6 million revolutions.

In conclusion, by virtue of the above technical solution, the ultra-lattice composite coating provided by the present application has good mechanical properties such as a good hardness and good binding force, has good friction and wear performance in a vacuum environment, and can meet the requirements on lubrication stability and long-service life of spatial mechanisms.

Next, the technical solution of the present application will be further described in combination with several preferred embodiments and drawings. These embodiments are implemented on the premise of the technical solution of the present invention, and give detailed implementations and specific operation processes, but the scope of protection of the present application is not limited to the following examples.

Experimental materials used in the following examples, unless stated otherwise, are all purchased from conventional biochemical reagent companies.

Example 1

In this example, a matrix material was a 316L, TC4 or a single-crystal silicon wafer. A $TiN_x$—$MoS_2/Zn-1$ ultra-lattice composite coating was prepared on the surface of a matrix by using an unbalanced magnetron sputtering technology. The main steps were as follows:

The surface of the matrix was mechanically polished, and the matrix material was ultrasonically cleaned in an acetone solution for 10 min, blown to be dry with nitrogen, then ultrasonically cleaned in an anhydrous ethanol solution for 10 min, and subsequently blown to be dry with nitrogen.

The cleaned matrix was put into an unbalanced magnetron sputtering cavity, the cavity was vacuumized until a vacuum degree was less than $1 \times 10^{-3}$ Pa, then the target was subjected to sputtering cleaning for 1200 s, and the temperature of the matrix was 50° C.-150° C. The $TiN_x$—$MoS_2/Zn-1$ ultra-lattice composite coating was prepared and deposited by filling the cavity with high-pure argon, using a Ti target (with a purity of 99.99 at. %), a MoS$_2$ target (with a purity of 99.9 at. %) and a Zn target (with a purity of 99.9 at. %) for distributed control and adopting an unbalanced magnetron sputtering technology. The specific steps were as follows:

Plasma etching: a bias voltage of −500 V was applied to the matrix, the program running time was 1800 s, and the temperature of the matrix was 150° C.

The sputtering current of the titanium target was 5.0 A, the bias voltage of the matrix was −80 V, the working gas was Ar, the flow of the gas was 30 sccm, the deposition temperature of the matrix was 120° C., the pressure was 1 Pa, the deposition time was 900 s, and the titanium transition layer with a thickness of about 150 nm was deposited on the surface of the matrix;

the sputtering current of the titanium target was 5.0 A, the bias voltage of the matrix was −80 V, the working gases were Ar and N$_2$, wherein the flow of the Ar gas was 30 sccm, the flow of the N$_2$ gas was 10 sccm, the deposition temperature of the matrix was 120° C., the pressure was 1 Pa, the deposition time was 2400 s, and the TiN$_x$ bearing layer with a thickness of about 150 nm was deposited on the surface of the titanium transition layer;

the sputtering current of the titanium target gradually decreased to 0 A while gradually increasing the sputtering current of the molybdenum disulfide target to 1.6 A, and the working gases were Ar and N$_2$, wherein the flow of the Ar gas was 16 sccm, the flow of the N$_2$ gas was 10 sccm, the bias voltage of the matrix was −50 V, the deposition temperature of the matrix was 80° C., the pressure was 1.0 Pa, the deposition time was 600 s, and the TiN$_x$/MoS$_2$ gradient transition layer with a thickness of about 100 nm was deposited on the surface of the TiN$_x$ bearing layer;

the sputtering current of the molybdenum disulfide target was maintained as 1.6 A while gradually increasing the sputtering current of the Zn target to 0.6 A, the working gas was Ar, the flow of the gas was 16 sccm, the bias voltage of the matrix was −50 V, the deposition temperature of the matrix was 80° C., the pressure was 1.0 Pa, the deposition time was 600 s, and the MoS$_2$/Zn gradient transition layer with a thickness of about 200 nm was deposited on the surface of the TiN$_x$/MoS$_2$ gradient transition layer;

the sputtering current of the molybdenum disulfide target was maintained as 1.6 A, the sputtering current of Zn was 0.6 A, MoS$_2$ and Zn were alternately deposited, the deposition time of the target in each period was 90 s, the total deposition time was 7000 s, and the MoS$_2$/Zn ultra-lattice layer with a thickness of about 2 μm was deposited on the surface of the MoS$_2$/Zn gradient transition layer.

The specific component parameters of the prepared TiN$_x$—MoS$_2$/Zn-1 ultra-lattice composite coating sample are as shown in Table 1.

The following tests were performed on the TiN$_x$—MoS$_2$/Zn-1 ultra-lattice composite coating prepared after deposition treatment as described above.

The thickness of the coating was tested by using a scanning electron microscope.

The hardness and elastic modulus of the coating were measured using MTSNanoIndenterG200 nanoindentation system, with a diamond indenter and a depth of 1/10 of the film thickness at 200 nm. The average value of 6 points was taken. The test results are as shown in Table 2.

Friction and wear test: tribological performance analysis was conducted in a vacuum environment by using a CSM friction test machine. 9Cr18 steel balls were used as counterparts, a reciprocating sliding mode was adopted, the frequency was 5 Hz, the track length was 5 mm, the running distance was 720 m, and the normal loading was 5 N. The test results of friction coefficients and wear rates are as shown in Table 2.

Example 2

In this example, a matrix material was a 316L, TC4 or a single-crystal silicon wafer. A TiN$_x$—MoS$_2$/Zn-2 ultra-lattice composite coating was prepared on the surface of a matrix by using an unbalanced magnetron sputtering technology. The main steps were as follows:

The surface of the matrix was mechanically polished, and the matrix material was ultrasonically cleaned in an acetone solution for 10 min, blown to be dry with nitrogen, then ultrasonically cleaned in an anhydrous ethanol solution for 10 min, and subsequently blown to be dry with nitrogen.

The cleaned matrix was put into an unbalanced magnetron sputtering cavity, the cavity was vacuumized until a vacuum degree was less than 1×10$^{-3}$ Pa, then the target was subjected to sputtering cleaning for 1200 s, and the temperature of the matrix was 50° C.-150° C. The TiN$_x$—MoS$_2$/Zn-2 ultra-lattice composite coating was prepared and deposited by filling the cavity with high-pure argon, using a Ti target (with a purity of 99.99 at. %), a MoS$_2$ target (with a purity of 99.9 at. %) and a Zn target (with a purity of 99.9 at. %) for distributed control and adopting an unbalanced magnetron sputtering technology. The specific steps were as follows:

Plasma etching: a bias voltage of −500 V was applied to the matrix, the program running time was 1800 s, and the temperature of the matrix was 150° C.

The sputtering current of the titanium target was 5.0 A, the bias voltage of the matrix was −80 V, the working gas was Ar, the flow of the gas was 30 sccm, the deposition temperature of the matrix was 120° C., the pressure was 1 Pa, the deposition time was 900 s, and the titanium transition layer with a thickness of about 150 nm was deposited on the surface of the matrix;

the sputtering current of the titanium target was 5.0 A, the bias voltage of the matrix was −80 V, the working gases were Ar and N$_2$, wherein the flow of the Ar gas was 30 sccm, the flow of the N$_2$ gas was 10 sccm, the deposition temperature of the matrix was 120° C., the pressure was 1 Pa, the deposition time was 4800 s, and the TiN$_x$ bearing layer with a thickness of about 300 nm was deposited on the surface of the titanium transition layer;

the sputtering current of the titanium target gradually decreased to 0 A while gradually increasing the sputtering current of the molybdenum disulfide target to 1.6 A, and the working gases were Ar and N$_2$, wherein the flow of the Ar gas was 16 sccm, the flow of the N$_2$ gas was 10 sccm, the bias voltage of the matrix was −50 V, the deposition temperature of the matrix was 80° C., the pressure was 1.0 Pa, the deposition time was 600 s, and the TiN$_x$/MoS$_2$ gradient transition layer with a thickness of about 100 nm was deposited on the surface of the TiN$_x$ bearing layer;

the sputtering current of the molybdenum disulfide target was maintained as 1.6 A while gradually increasing the sputtering current of the Zn target to 0.6 A, the working gas was Ar, the flow of the gas was 16 sccm, the bias voltage of the matrix was −50 V, the deposition temperature of the matrix was 80° C., the pressure was 1.0 Pa, the deposition time was 600 s, and the MoS$_2$/Zn gradient transition layer with a thickness of about 200 nm was deposited on the surface of the TiN$_x$/MoS$_2$ gradient transition layer;

the sputtering current of the molybdenum disulfide target was maintained as 1.6 A, the sputtering current of Zn was 0.6 A, MoS$_2$ and Zn were alternately deposited, the deposition time of the target in each period was 90 s, the total deposition time was 7000 s, and the MoS$_2$/Zn ultra-lattice layer with a thickness of about 2 μm was deposited on the surface of the MoS$_2$/Zn gradient transition layer.

The specific component parameters of the prepared TiN$_x$—MoS$_2$/Zn-2 ultra-lattice composite coating sample are as shown in Table 1.

The following tests were performed on the TiN$_x$—MoS$_2$/Zn-2 ultra-lattice composite coating prepared after deposition treatment as described above:

The thickness of the coating was tested by using a scanning electron microscope.

The hardness and elastic modulus of the coating were measured using MTSNanoIndenterG200 nanoindentation system, with a diamond indenter and a depth of 1/10 of the film thickness at 200 nm. The average value of 6 points was taken. The test results are as shown in Table 2.

Friction and wear test: tribological performance analysis was conducted in a vacuum environment by using a CSM friction test machine. 9Cr18 steel balls were used as counterparts, a reciprocating sliding mode was adopted, the frequency was 5 Hz, the track length was 5 mm, the running distance was 720 m, and the normal loading was 5 N. The test results of friction coefficients and wear rates are as shown in Table 2.

Example 3

In this example, a matrix material was a 316L, TC4 or a single-crystal silicon wafer. A TiN$_x$—MoS$_2$/Zn-3 ultra-lattice composite coating was prepared on the surface of a matrix by using an unbalanced magnetron sputtering technology. The main steps were as follows:

The surface of the matrix was mechanically polished, and the matrix material was ultrasonically cleaned in an acetone solution for 10 min, blown to be dry with nitrogen, then ultrasonically cleaned in an anhydrous ethanol solution for 10 min, and subsequently blown to be dry with nitrogen.

The cleaned matrix was put into an unbalanced magnetron sputtering cavity, the cavity was vacuumized until a vacuum degree was less than 1×10$^{-3}$ Pa, then the target was subjected to sputtering cleaning for 1200 s, and the temperature of the matrix was 50° C.-150° C. The TiN$_x$—MoS$_2$/Zn-3 ultra-lattice composite coating was prepared and deposited by filling the cavity with high-pure argon, using a Ti target (with a purity of 99.99 at. %), a MoS$_2$ target (with a purity of 99.9 at. %) and a Zn target (with a purity of 99.9 at. %) for distributed control and adopting an unbalanced magnetron sputtering technology. The specific steps were as follows:

Plasma etching: a bias voltage of −500 V was applied to the matrix, the program running time was 1800 s, and the temperature of the matrix was 150° C.

The sputtering current of the titanium target was 5.0 A, the bias voltage of the matrix was −80 V, the working gas was Ar, the flow of the gas was 30 sccm, the deposition temperature of the matrix was 120° C., the pressure was 1 Pa, the deposition time was 900 s, and the titanium transition layer with a thickness of about 150 nm was deposited on the surface of the matrix;

the sputtering current of the titanium target was 5.0 A, the bias voltage of the matrix was −80 V, and the working gases were Ar and N$_2$, wherein the flow of the Ar gas was 30 sccm, the flow of the N$_2$ gas was 10 sccm, the deposition temperature of the matrix was 120° C., the pressure was 1 Pa, the deposition time was 3600 s, and the TiN$_x$ bearing layer with a thickness of about 220 nm was deposited on the surface of the titanium transition layer;

the sputtering current of the titanium target gradually decreased to 0 A while gradually increasing the sputtering current of the molybdenum disulfide target to 1.6 A, and the working gases were Ar and N$_2$, wherein the flow of the Ar gas was 16 sccm, the flow of the N$_2$ gas was 10 sccm, the bias voltage of the matrix was −50 V, the deposition temperature of the matrix was 80° C., the pressure was 1.0 Pa, the deposition time was 600 s, and the TiN$_x$/MoS$_2$ gradient transition layer with a thickness of about 100 nm was deposited on the surface of the TiN$_x$ bearing layer;

the sputtering current of the molybdenum disulfide target was maintained as 1.6 A while gradually increasing the sputtering current of the Zn target to 0.6 A, the working gas was Ar, the flow of the gas was 16 sccm, the bias voltage of the matrix was −50 V, the deposition temperature of the matrix was 80° C., the pressure was 1.0 Pa, the deposition time was 600 s, and the MoS$_2$/Zn gradient transition layer with a thickness of about 200 nm was deposited on the surface of the TiN$_x$/MoS$_2$ gradient transition layer;

the sputtering current of the molybdenum disulfide target was maintained as 1.6 A, the sputtering current of Zn was 0.6 A, MoS$_2$ and Zn were alternately deposited, the deposition time of the target in each period was 90 s, the total deposition time was 7000 s, and the MoS$_2$/Me ultra-lattice layer with a thickness of about 2 μm was deposited on the surface of the MoS$_2$/Zn gradient transition layer.

The specific component parameters of the prepared TiN$_x$—MoS$_2$/Zn-3 ultra-lattice composite coating sample are as shown in Table 1.

The following tests were performed on the TiN$_x$—MoS$_2$/Zn-3 ultra-lattice composite coating prepared after deposition treatment as described above:

The thickness of the coating was tested by using a scanning electron microscope.

The hardness and elastic modulus of the coating were measured using MTSNanoIndenterG200 nanoindentation system, with a diamond indenter and a depth of 1/10 of the film thickness at 200 nm. The average value of 6 points was taken. The test results are as shown in Table 2.

Binding force test: the binding force of the coating was tested by using an automatic scratch testing machine, which was operated according to the procedures of the automatic scratch testing machine. 3 scratch testes were conducted at different positions. The experimental conditions were as follows: the loading velocity was 5 N/min-10 N/min, the scratch length was 5 mm, and the loading force was 20 N. The test results showed that the binding force of the prepared TiN$_x$—MoS$_2$/Zn-3 ultra-lattice composite coating was up to 18 N.

Friction and wear test: tribological performance analysis was conducted in a vacuum environment by using a CSM friction test machine. 9Cr18 steel balls were used as counterparts, a reciprocating sliding mode was adopted, the frequency was 5 Hz, the track length was 5 mm, the running distance was 720 m, and the normal loading was 5 N. The test results of friction coefficients and wear rates are as shown in Table 2.

Friction life test: tribological performance analysis was conducted in a vacuum environment by using a CSM friction test machine. 9Cr18 steel balls were used as counterparts, a rotation mode was adopted, the number of revolutions was 1000 rpm, the track radius was 8 mm, the normal loading was 5 N. The test results showed that during the entire friction test, the friction coefficients were all less than 0.02, and the friction life was up to $4 \times 10^6$ million revolutions.

Figure 1:
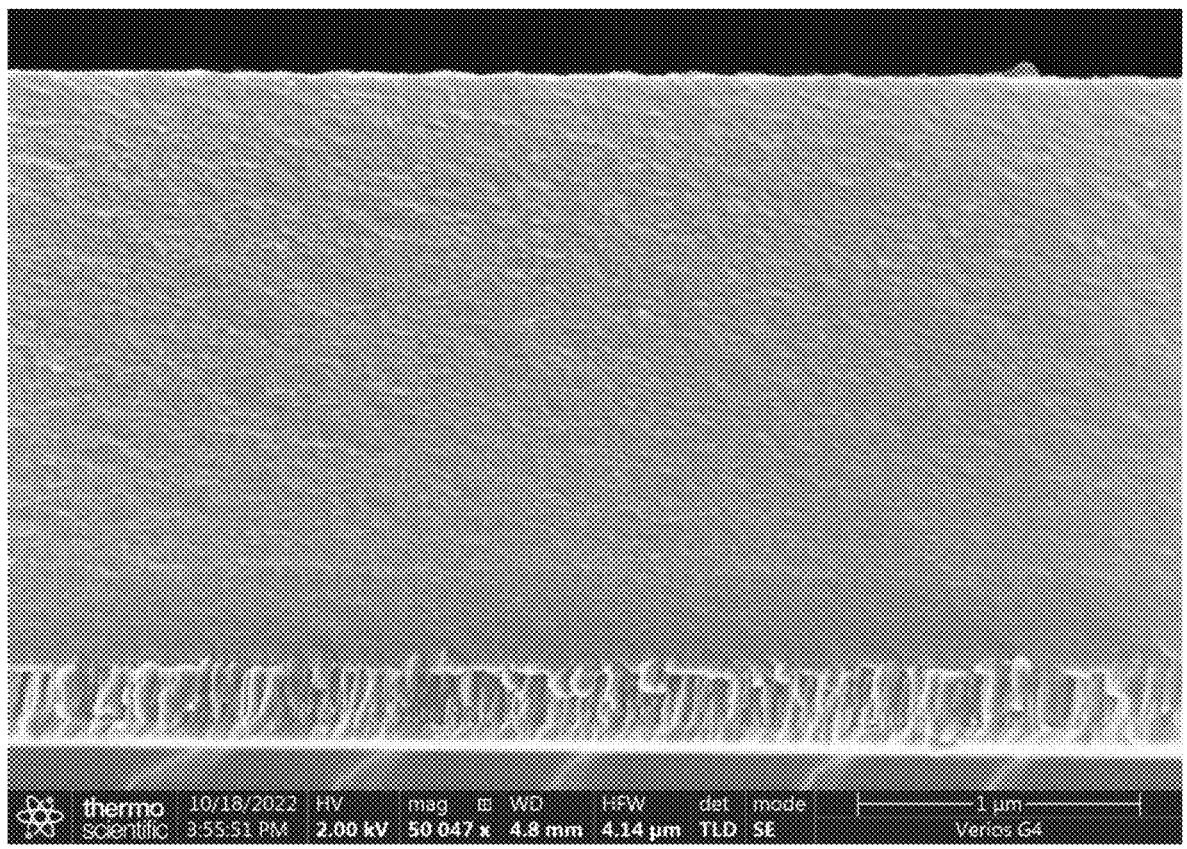
FIG. 1 is a scanning electron microscopy (SEM) image of a cross section of a $TiN_x$—$MoS_2$/Zn-3 coating prepared in example 3 according to the present application.
Figure 2:
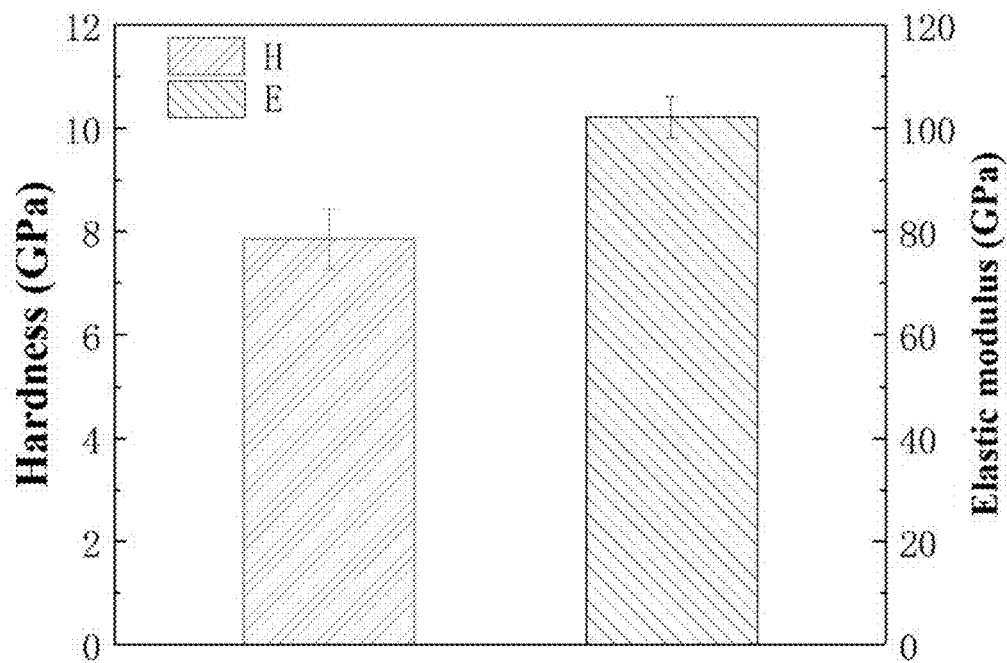
FIG. 2 is a hardness and elastic modulus test diagram of a $TiN_x$—$MoS_2$/Zn-3 coating prepared in example 3 according to the present application.
Figure 3:
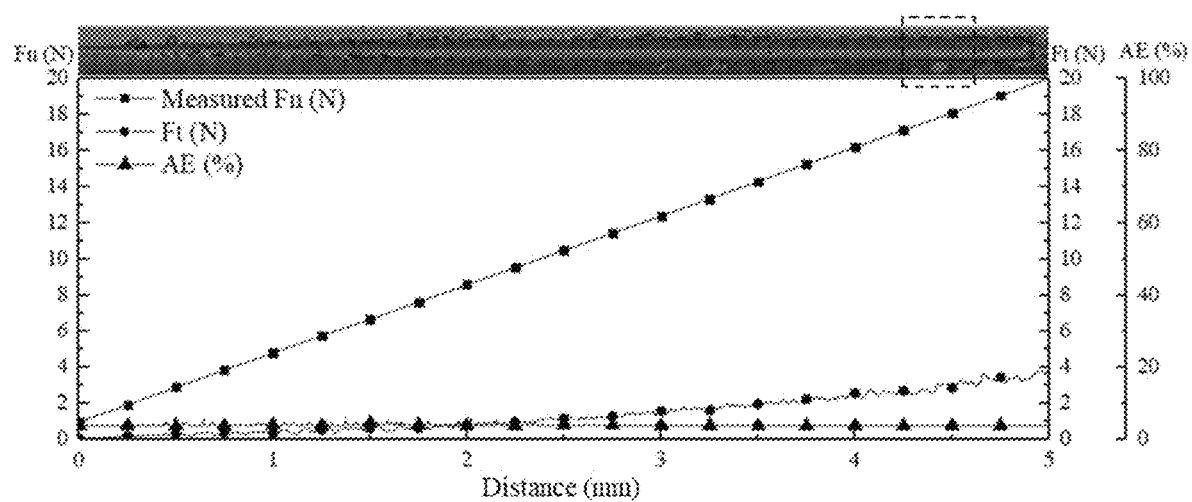
FIG. 3 is a binding force morphology and force curve diagram of a $TiN_x$—$MoS_2$/Zn-3 coating prepared in example 3 according to the present application.
Figure 4:
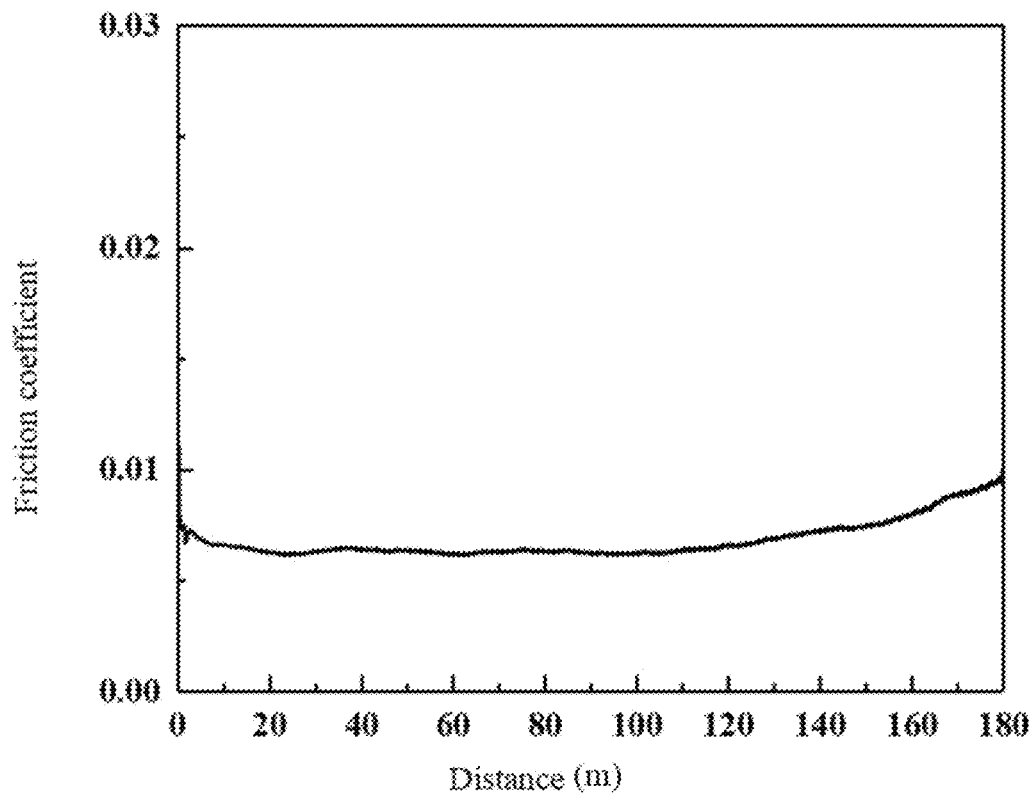
FIG. 4 is a friction curve diagram of a $TiN_x$—$MoS_2$/Zn-3 coating prepared in example 3 according to the present application in a vacuum environment.
Figure 5:
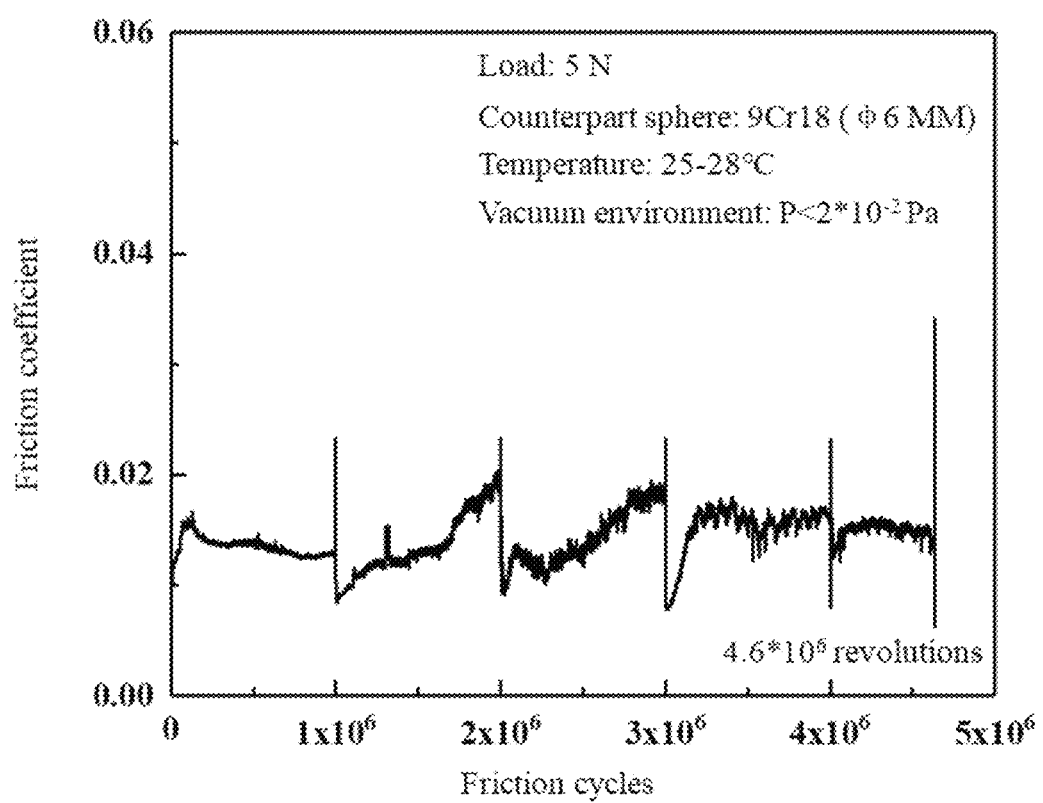
FIG. 5 is a friction life curve diagram of a $TiN_x$—$MoS_2$/Zn-3 coating prepared in example 3 according to the present application in a vacuum environment.

The SEM image of the cross section of the $TiN_x$—$MoS_2$/Zn-3 coating prepared in this example is as shown in FIG. 1; the test diagram of the hardness and elastic modulus of the prepared $TiN_x$—$MoS_2$/Zn-3 coating is as shown in FIG. 2; the binding force morphology and force curve diagram of the prepared $TiN_x$—$MoS_2$/Zn-3 coating is as shown in FIG. 3; the friction curve of the prepared $TiN_x$—$MoS_2$/Zn-3 coating in a vacuum environment is as shown in FIG. 4; and the friction lift curve of $TiN_x$—$MoS_2$/Zn-3 coating in a vacuum environment is as shown in FIG. 5.

Example 4

In this example, a matrix material was a 316L, TC4 or a single-crystal silicon wafer. A $TiN_x$—$MoS_2$/Ti ultra-lattice composite coating was prepared on the surface of a matrix by using an unbalanced magnetron sputtering technology. The main steps were as follows:

The surface of the matrix was mechanically polished, and the matrix material was ultrasonically cleaned in an acetone solution for 10 min, blown to be dry with nitrogen, then ultrasonically cleaned in an anhydrous ethanol solution for 10 min, and subsequently blown to be dry with nitrogen.

The cleaned matrix was put into an unbalanced magnetron sputtering cavity, the cavity was vacuumized until a vacuum degree was less than $1 \times 10^{-3}$ Pa, then the target was subjected to sputtering cleaning for 1200 s, and the temperature of the matrix was 50° C.-150° C. The $TiN_x$—$MoS_2$/Ti ultra-lattice composite coating was prepared and deposited by filling the cavity with high-pure argon, using a Ti target (with a purity of 99.99 at. %), a $MoS_2$ target (with a purity of 99.9 at. %) and the Ti target (with a purity of 99.9 at. %) for distributed control and adopting an unbalanced magnetron sputtering technology. The specific steps were as follows:

Plasma etching: a bias voltage of −500 V was applied to the matrix, the program running time was 1800 s, and the temperature of the matrix was 150° C.

The sputtering current of the titanium target was 5.0 A, the bias voltage of the matrix was −80 V, the working gas was Ar, the flow of the gas was 30 sccm, the deposition temperature of the matrix was 120° C., the pressure was 1 Pa, the deposition time was 900 s, and the titanium transition layer with a thickness of about 150 nm was deposited on the surface of the matrix;

the sputtering current of the titanium target was 5.0 A, the bias voltage of the matrix was −80 V, and the working gases were Ar and $N_2$, wherein the flow of the Ar gas was 30 sccm, the flow of the $N_2$ gas was 10 sccm, the deposition temperature of the matrix was 120° C., the pressure was 1 Pa, the deposition time was 3600 s, and the $TiN_x$ bearing layer with a thickness of about 220 nm was deposited on the surface of the titanium transition layer;

the sputtering current of the titanium target gradually decreased to 0 A while gradually increasing the sputtering current of the molybdenum disulfide target to 1.6 A, and the working gases were Ar and $N_2$, wherein the flow of the Ar gas was 16 sccm, the flow of the $N_2$ gas was 10 sccm, the bias voltage of the matrix was −50 V, the deposition temperature of the matrix was 80° C., the pressure was 1.0 Pa, the deposition time was 600 s, and the $TiN_x$/$MoS_2$ gradient transition layer with a thickness of about 100 nm was deposited on the surface of the $TiN_x$ bearing layer;

the sputtering current of the molybdenum disulfide target was maintained as 1.6 A while gradually increasing the sputtering current of the Ti target to 1.2 A, the working gas was Ar, the flow of the gas was 16 sccm, the bias voltage of the matrix was −50 V, the deposition temperature of the matrix was 80° C., the pressure was 1.0 Pa, the deposition time was 600 s, and the $MoS_2$/Ti gradient transition layer with a thickness of about 200 nm was deposited on the surface of the $TiN_x$/$MoS_2$ gradient transition layer;

the sputtering current of the molybdenum disulfide target was maintained as 1.6 A, the sputtering current of Ti was 1.2 A, $MoS_2$ and Ti were alternately deposited, the deposition time of the target in each period was 90 s, the total deposition time was 7000 s, and the $MoS_2$/Ti ultra-lattice layer with a thickness of about 2 μm was deposited on the surface of the $MoS_2$/Ti gradient transition layer.

The specific component parameters of the prepared $TiN_x$—$MoS_2$/Ti ultra-lattice composite coating sample are as shown in Table 1.

The following tests were performed on the $TiN_x$—$MoS_2$/Ti ultra-lattice composite coating prepared after deposition treatment as described above:

The thickness of the coating was tested by using a scanning electron microscope.

The hardness and elastic modulus of the coating were measured using MTSNanoIndenterG200 nanoindentation system, with a diamond indenter and a depth of ¹/₁₀ of the film thickness at 200 nm. The average value of 6 points was taken. The test results are as shown in Table 2.

Friction and wear test: tribological performance analysis was conducted in a vacuum environment by using a CSM friction test machine. 9Cr18 steel balls were used as counterparts, a reciprocating sliding mode was adopted, the frequency was 5 Hz, the track length was 5 mm, the running distance was 720 m, and the normal loading was 5 N. The test results of friction coefficients and wear rates are as shown in Table 2.

Example 5

In this example, a matrix material was a 316L, TC4 or a single-crystal silicon wafer. A $TiN_x$—$MoS_2$/Cr ultra-lattice composite coating was prepared on the surface of a matrix by using an unbalanced magnetron sputtering technology. The main steps were as follows:

The matrix blown to be dry with nitrogen was ultrasonically cleaned for 10 min in an absolute ethyl alcohol, and then blown to be dry with nitrogen.

The cleaned matrix was put into an unbalanced magnetron sputtering cavity, the cavity was vacuumized until a vacuum degree was less than 1×10⁻³ Pa, then the target was subjected to sputtering cleaning for 1200 s, and the temperature of the matrix was 50° C.-150° C. The TiN$_x$—MoS$_2$/Cr ultra-lattice composite coating was prepared and deposited by filling the cavity with high-pure argon, using a Ti target (with a purity of 99.99 at. %), a MoS$_2$ target (with a purity of 99.9 at. %) and a Cr target (with a purity of 99.9 at. %) for distributed control and adopting an unbalanced magnetron sputtering technology. The specific steps were as follows:

Plasma etching: a bias voltage of −500 V was applied to the matrix, the program running time was 1800 s, and the temperature of the matrix was 150° C.

The sputtering current of the titanium target was 5.0 A, the bias voltage of the matrix was −80 V, the working gas was Ar, the flow of the gas was 30 sccm, the deposition temperature of the matrix was 120° C., the pressure was 1 Pa, the deposition time was 900 s, and the titanium transition layer with a thickness of about 150 nm was deposited on the surface of the matrix;

the sputtering current of the titanium target was 5.0 A, the bias voltage of the matrix was −80 V, and the working gases were Ar and N$_2$, wherein the flow of the Ar gas was 30 sccm, the flow of the N$_2$ gas was 10 sccm, the deposition temperature of the matrix was 120° C., the pressure was 1 Pa, the deposition time was 3600 s, and the TiN$_x$ bearing layer with a thickness of about 220 nm was deposited on the surface of the titanium transition layer;

the sputtering current of the titanium target gradually decreased to 0 A while gradually increasing the sputtering current of the molybdenum disulfide target to 1.6 A, and the working gases were Ar and N$_2$, wherein the flow of the Ar gas was 16 sccm, the flow of the N$_2$ gas was 10 sccm, the bias voltage of the matrix was −50 V, the deposition temperature of the matrix was 80° C., the pressure was 1.0 Pa, the deposition time was 600 s, and the TiN$_x$/MoS$_2$ gradient transition layer with a thickness of about 100 nm was deposited on the surface of the TiN$_x$ bearing layer;

the sputtering current of the molybdenum disulfide target was maintained as 1.6 A while gradually increasing the sputtering current of the Cr target to 1.0 A, the working gas was Ar, the flow of the gas was 16 sccm, the bias voltage of the matrix was −50 V, the deposition temperature of the matrix was 80° C., the pressure was 1.0 Pa, the deposition time was 600 s, and the MoS$_2$/Cr gradient transition layer with a thickness of about 200 nm was deposited on the surface of the TiN$_x$/MoS$_2$ gradient transition layer;

the sputtering current of the molybdenum disulfide target was maintained as 1.6 A, the sputtering current of Cr was 0.6 A, MoS$_2$ and Cr were alternately deposited, the deposition time of the target in each period was 90 s, the total deposition time was 7000 s, and the MoS$_2$/Cr ultra-lattice layer with a thickness of about 2 μm was deposited on the surface of the MoS$_2$/Cr gradient transition layer.

The specific component parameters of the prepared TiN$_x$—MoS$_2$/Cr ultra-lattice composite coating sample are as shown in Table 1.

The following tests were performed on the TiN$_x$—MoS$_2$/Cr ultra-lattice composite coating prepared after deposition treatment as described above:

The thickness of the coating was tested by using a scanning electron microscope.

The hardness and elastic modulus of the coating were measured using MTSNanoIndenterG200 nanoindentation system, with a diamond indenter and a depth of 1/10 of the film thickness at 200 nm. The average value of 6 points was taken. The test results are as shown in Table 2.

Friction and wear test: tribological performance analysis was conducted in a vacuum environment by using a CSM friction test machine. 9Cr18 steel balls were used as counterparts, a reciprocating sliding mode was adopted, the frequency was 5 Hz, the track length was 5 mm, the running distance was 720 m, and the normal loading was 5 N. The test results of friction coefficients and wear rates are as shown in Table 2.

Comparative Example 1

In this comparative example, a matrix material was a 316L, TC4 or a single-crystal silicon wafer. A molybdenum disulfide coating was prepared on the surface of a matrix by using an unbalanced magnetron sputtering technology. The main steps were as follows:

The surface of the matrix was mechanically polished, and the matrix material was ultrasonically cleaned in an acetone solution for 10 min, blown to be dry with nitrogen, then ultrasonically cleaned in an anhydrous ethanol solution for 10 min, and subsequently blown to be dry with nitrogen.

The cleaned matrix was put into an unbalanced magnetron sputtering cavity, the cavity was vacuumized until a vacuum degree was less than 1×10⁻³ Pa, then the target was subjected to sputtering cleaning for 1200 s, and the temperature of the matrix was 50° C.-150° C. The MoS$_2$ ultra-lattice composite coating was prepared and deposited by filling the cavity with high-pure argon, using a Ti target (with a purity of 99.99 at. %) and a MoS$_2$ target (with a purity of 99.9 at. %) for distributed control and adopting an unbalanced magnetron sputtering technology. The specific steps were as follows:

Plasma etching: a bias voltage of −400 V was applied to a matrix, the program running time was 1200 s, and the temperature of the matrix was 120° C.

The sputtering current of the titanium target was 5 A, the bias voltage of the matrix was −100 V, the working gas was Ar, the flow of the gas was 15 sccm, the deposition temperature of the matrix was 120° C., the pressure was 0.8 Pa, the deposition time was 1000 s, and the titanium transition layer with a thickness of about 200 nm was deposited on the surface of the matrix;

the sputtering current of the titanium target gradually decreased to 0 A while gradually increasing the sputtering current of the molybdenum disulfide target to 1.6 A, the working gas was Ar, the flow of the gas was 18 sccm, the bias voltage of the matrix was −50 V, the deposition temperature of the matrix was 80° C., the pressure was 0.8 Pa, the deposition time was 1000 s, and the Ti/MoS$_2$ gradient transition layer with a thickness of about 250 nm was deposited on the surface of the titanium transition layer;

the sputtering current of the molybdenum disulfide target was maintained as 1.6 A, other conditions unchanged, the deposition time was 8000 s, until the total thickness of the molybdenum disulfide coating was up to 2.5 μm.

The specific component parameters of the prepared MoS$_2$ coating sample are as shown in Table 1.

The following tests were performed on the MoS$_2$ coating prepared after the deposition treatment as described above:

The thickness of the coating was tested by using a scanning electron microscope.

The hardness and elastic modulus of the coating were measured using MTSNanoIndenterG200 nanoindentation system, with a diamond indenter and a depth of 1/10 of the film thickness at 200 nm. The average value of 6 points was taken. The test results are as shown in Table 2.

Binding force test: the binding force of the coating was tested by using an automatic scratch testing machine, which was operated according to the procedures of the automatic scratch testing machine. 3 scratch testes were conducted at different positions. The experimental conditions were as follows: the loading velocity was 5 N/min-10 N/min, the scratch length was 5 mm, and the loading force was 20 N. The test results are as shown in Table 2.

Friction and wear test: tribological performance analysis was conducted in a vacuum environment by using a CSM friction test machine. 9Cr18 steel balls were used as counterparts, a reciprocating sliding mode was adopted, the frequency was 5 Hz, the track length was 5 mm, the running distance was 720 m, and the normal loading was 5 N. The test results of friction coefficients and wear rates are as shown in Table 2.

Comparative Example 2

In this example, a matrix material was a 316L, TC4 or a single-crystal silicon wafer. A $MoS_2$—Zn-1 composite coating was prepared on the surface of a matrix by using an unbalanced magnetron sputtering technology. The main steps were as follows:

The surface of the matrix was mechanically polished, and the matrix material was ultrasonically cleaned in an acetone solution for 10 min, blown to be dry with nitrogen, then ultrasonically cleaned in an anhydrous ethanol solution for 10 min, and subsequently blown to be dry with nitrogen.

The cleaned matrix was put into an unbalanced magnetron sputtering cavity, the cavity was vacuumized until a vacuum degree was less than $1\times10^{-3}$ Pa, then the target was subjected to sputtering cleaning for 1200 s, and the temperature of the matrix was 50° C.-150° C. The $MoS_2$—Zn composite coating was prepared and deposited by filling the cavity with high-pure argon, using a Ti target (with a purity of 99.99 at. %), a $MoS_2$ target (with a purity of 99.9 at. %) and a Zn target (with a purity of 99.9 at. %) for distributed control and adopting an unbalanced magnetron sputtering technology. The specific steps were as follows:

Plasma etching: a bias voltage of −500 V was applied to the matrix, the program running time was 1800 s, and the temperature of the matrix was 150° C.

The sputtering current of the titanium target was 5.0 A, the bias voltage of the matrix was −80 V, the working gas was Ar, the flow of the gas was 30 sccm, the deposition temperature of the matrix was 120° C., the pressure was 1 Pa, the deposition time was 900 s, and the titanium transition layer with a thickness of about 300 nm was deposited on the surface of the matrix;

the sputtering current of the titanium target gradually decreased to 0 A while gradually increasing the sputtering current of the molybdenum disulfide target to 1.6 A and increasing the sputtering current of the Zn target to 0.6 A, the working gas was Ar, the flow of the gas was 16 sccm, the bias voltage of the matrix was −50 V, the deposition temperature of the matrix was 80° C., the pressure was 1.0 Pa, the deposition time was 1200 s, and the Ti/$MoS_2$/Zn gradient transition layer with a thickness of about 300 nm was deposited on the surface of the titanium transition layer;

the sputtering current of the molybdenum disulfide target was maintained as 1.6 A, the sputtering current of Zn was 0.6 A, $MoS_2$ and Zn were co-deposited, and the total deposition time was 7000 s, until the thickness of the $MoS_2$—Zn coating was up to 2.5 μm.

The specific component parameters of the prepared $MoS_2$—Zn-1 coating sample are as shown in Table 1.

The following tests were performed on the $MoS_2$—Zn-1 coating prepared after the deposition treatment as described above:

The thickness of the coating was tested by using a scanning electron microscope.

The hardness and elastic modulus of the coating were measured using MTSNanoIndenterG200 nanoindentation system, with a diamond indenter and a depth of 1/10 of the film thickness at 200 nm. The average value of 6 points was taken. The test results are as shown in Table 2.

Binding force test: the binding force of the coating was tested by using an automatic scratch testing machine, which was operated according to the procedures of the automatic scratch testing machine. 3 scratch testes were conducted at different positions. The experimental conditions were as follows: the loading velocity was 5 N/min-10 N/min, the scratch length was 5 mm, and the loading force was 20 N. The test results are as shown in Table 2.

Friction and wear test: tribological performance analysis was conducted in a vacuum environment by using a CSM friction test machine. 9Cr18 steel balls were used as counterparts, a reciprocating sliding mode was adopted, the frequency was 5 Hz, the track length was 5 mm, the running distance was 720 m, and the normal loading was 5 N. The test results of friction coefficients and wear rates are as shown in Table 2.

Comparative Example 3

In this example, a matrix material was a 316L, TC4 or a single-crystal silicon wafer. A $MoS_2$—Zn-2 composite coating was prepared on the surface of a matrix by using an unbalanced magnetron sputtering technology. The main steps were as follows:

The surface of the matrix was mechanically polished, and the matrix material was ultrasonically cleaned in an acetone solution for 10 min, blown to be dry with nitrogen, then ultrasonically cleaned in an anhydrous ethanol solution for 10 min, and subsequently blown to be dry with nitrogen.

The cleaned matrix was put into an unbalanced magnetron sputtering cavity, the cavity was vacuumized until a vacuum degree was less than $1\times10^{-3}$ Pa, then the target was subjected to sputtering cleaning for 1200 s, and the temperature of the matrix was 50° C.-150° C. The $MoS_2$—Zn-2 composite coating was prepared and deposited by filling the cavity with high-pure argon, using a Ti target (with a purity of 99.99 at. %), a $MoS_2$ target (with a purity of 99.9 at. %) and a Zn target for distributed control and adopting an unbalanced magnetron sputtering technology. The specific steps were as follows:

Plasma etching: a bias voltage of −500 V was applied to the matrix, the program running time was 1800 s, and the temperature of the matrix was 150° C.

The sputtering current of the titanium target was 5.0 A, the bias voltage of the matrix was −80 V, the working gas was Ar, the flow of the gas was 30 sccm, the deposition temperature of the matrix was 120° C., the pressure was 1 Pa, the deposition time was 900 s, and the titanium transition layer with a thickness of about 150 nm was deposited on the surface of the matrix;

the sputtering current of the titanium target gradually decreased to 0 A while gradually increasing the sputtering current of the molybdenum disulfide target to 1.6 A, the working gas was Ar, the flow of the gas was 16 sccm, the bias voltage of the matrix was −50 V, the deposition temperature of the matrix was 80° C., the pressure was 1.0 Pa, the deposition time was 600 s, and the thickness of the $MoS_2$ transition layer was about 100 nm;

the sputtering current of the molybdenum disulfide target was maintained as 1.6 A while gradually increasing the sputtering current of the Zn target to 0.6 A, the working gas was Ar, the flow of the gas was 16 sccm, the bias voltage of the matrix was −50 V, the deposition temperature of the matrix was 80° C., the pressure was 1.0 Pa, the deposition time was 600 s, and the $MoS_2$/Zn gradient transition layer with a thickness of about 200 nm was deposited on the surface of the $MoS_2$ gradient transition layer;

the sputtering current of the molybdenum disulfide target was maintained as 1.6 A, the sputtering current of Zn was 0.6 A, $MoS_2$ and Zn were alternately deposited, the deposition time of the target in each period was 90 s, the total deposition time was 7000 s, and the $MoS_2$/Me ultra-lattice layer with a thickness of about 2 μm was deposited on the surface of the gradient transition layer.

The specific component parameters of the prepared $MoS_2$—Zn-2 composite coating sample are as shown in Table 1.

The following tests were performed on the $MoS_2$—Zn-2 composite coating prepared after the deposition treatment as described above.

The thickness of the coating was tested by using a scanning electron microscope.

The hardness and elastic modulus of the coating were measured using MTSNanoIndenterG200 nanoindentation system, with a diamond indenter and a depth of 1/10 of the film thickness at 200 nm. The average value of 6 points was taken. The test results are as shown in Table 2.

Binding force test: the binding force of the coating was tested by using an automatic scratch testing machine, which was operated according to the procedures of the automatic scratch testing machine. 3 scratch testes were conducted at different positions. The experimental conditions were as follows: the loading velocity was 5 N/min-10 N/min, the scratch length was 5 mm, and the loading force was 20 N. The test results are as shown in Table 2.

Friction and wear test: tribological performance analysis was conducted in a vacuum environment by using a CSM friction test machine. 9Cr18 steel balls were used as counterparts, a reciprocating sliding mode was adopted, the frequency was 5 Hz, the track length was 5 mm, the running distance was 720 m, and the normal loading was 5 N. The test results of friction coefficients and wear rates are as shown in Table 2.

Comparative Example 4

In this example, a matrix material was a 316L, TC4 or a single-crystal silicon wafer. A $MoS_2$—Zn-3 composite coating was prepared on the surface of a matrix by using an unbalanced magnetron sputtering technology. The main steps were as follows:

The surface of the matrix was mechanically polished, and the matrix material was ultrasonically cleaned in an acetone solution for 10 min, blown to be dry with nitrogen, then ultrasonically cleaned in an anhydrous ethanol solution for 10 min, and subsequently blown to be dry with nitrogen.

The cleaned matrix was put into an unbalanced magnetron sputtering cavity, the cavity was vacuumized until a vacuum degree was less than $1×10^{-3}$ Pa, then the target was subjected to sputtering cleaning for 1200 s, and the temperature of the matrix was 50° C.-150° C. The $MoS_2$—Zn-3 composite coating was prepared and deposited by filling the cavity with high-pure argon, using a Ti target (with a purity of 99.99 at. %), a $MoS_2$ target (with a purity of 99.9 at. %) and a Zn target for distributed control and adopting an unbalanced magnetron sputtering technology. The specific steps were as follows:

Plasma etching: a bias voltage of −500 V was applied to the matrix, the program running time was 1800 s, and the temperature of the matrix was 150° C.

The sputtering current of the titanium target was 5.0 A, the bias voltage of the matrix was −80 V, the working gas was Ar, the flow of the gas was 30 sccm, the deposition temperature of the matrix was 120° C., the pressure was 1 Pa, the deposition time was 900 s, and the titanium transition layer with a thickness of about 150 nm was deposited on the surface of the matrix;

the sputtering current of the titanium target was 5.0 A, the bias voltage of the matrix was −80 V, and the working gases were Ar and $N_2$, wherein the flow of the Ar gas was 30 sccm, the flow of the $N_2$ gas was 10 sccm, the deposition temperature of the matrix was 120° C., the pressure was 1 Pa, the deposition time was 3600 s, and the $TiN_x$ bearing layer with a thickness of about 220 nm was deposited on the surface of the titanium transition layer;

the sputtering current of the titanium target gradually decreased to 0 A while gradually increasing the sputtering current of the molybdenum disulfide target to 1.6 A, the working gases were Ar and $N_2$, wherein the flow of Ar gas was 16 sccm, the flow of $N_2$ gas was 10 sccm, the bias voltage of the matrix was −50 V, the deposition temperature of the matrix was 80° C., the pressure was 1.0 Pa, the deposition time was 600 s, and the $MoS_2$ transition layer with a thickness of about 100 nm was deposited on the surface of the $TiN_x$ bearing layer;

the sputtering current of the molybdenum disulfide target was maintained as 1.6 A while gradually increasing the sputtering current of the Zn target to 0.6 A, the working gas was Ar, the flow of the gas was 16 sccm, the bias voltage of the matrix was −50 V, the deposition temperature of the matrix was 80° C., the pressure was 1.0 Pa, the deposition time was 600 s, and the $MoS_2$/Zn gradient transition layer with a thickness of about 200 nm was deposited on the surface of the $MoS_2$ transition layer;

the sputtering current of the molybdenum disulfide target was maintained as 1.6 A, the sputtering current of Zn was 0.6 A, $MoS_2$ and Zn were alternately deposited, the deposition time of the target in each period was 90 s, the total deposition time was 7000 s, and the $MoS_2$/Me ultra-lattice layer with a thickness of about 2 μm was deposited on the surface of the gradient transition layer.

The specific component parameters of the prepared $MoS_2$—Zn-3 composite coating sample are as shown in Table 1.

The following tests were performed on the $MoS_2$—Zn-3 composite coating prepared after the deposition treatment as described above.

The thickness of the coating was tested by using a scanning electron microscope.

The hardness and elastic modulus of the coating were measured using MTSNanoIndenterG200 nanoindentation system, with a diamond indenter and a depth of 1/10 of the film thickness at 200 nm. The average value of 6 points was taken. The test results are as shown in Table 2.

Binding force test: the binding force of the coating was tested by using an automatic scratch testing machine, which was operated according to the procedures of the automatic scratch testing machine. 3 scratch testes were conducted at different positions. The experimental conditions were as follows: the loading velocity was 5 N/min-10 N/min, the scratch length was 5 mm, and the loading force was 20 N. The test results are as shown in Table 2.

Friction and wear test: tribological performance analysis was conducted in a vacuum environment by using a CSM friction test machine. 9Cr18 steel balls were used as counterparts, a reciprocating sliding mode was adopted, the frequency was 5 Hz, the track length was 5 mm, the running distance was 720 m, and the normal loading was 5 N. The test results of friction coefficients and wear rates are as shown in Table 2.

Comparative Example 5

In this example, a matrix material was a 316L, TC4 or a single-crystal silicon wafer. A $MoS_2$—Zn-4 composite coating was prepared on the surface of a matrix by using an unbalanced magnetron sputtering technology. The main steps were as follows:

The surface of the matrix was mechanically polished, and the matrix material was ultrasonically cleaned in an acetone solution for 10 min, blown to be dry with nitrogen, then ultrasonically cleaned in an anhydrous ethanol solution for 10 min, and subsequently blown to be dry with nitrogen.

The cleaned matrix was put into an unbalanced magnetron sputtering cavity, the cavity was vacuumized until a vacuum degree was less than $1\times10^{-3}$ Pa, then the target was subjected to sputtering cleaning for 1200 s, and the temperature of the matrix was 50° C.-150° C. The $MoS_2$—Zn-4 composite coating was prepared and deposited by filling the cavity with high-pure argon, using a Ti target (with a purity of 99.99 at. %), a $MoS_2$ target (with a purity of 99.9 at. %) and a Zn target for distributed control and adopting an unbalanced magnetron sputtering technology. The specific steps were as follows:

Plasma etching: a bias voltage of −500 V was applied to the matrix, the program running time was 1800 s, and the temperature of the matrix was 150° C.

The sputtering current of the titanium target was 5.0 A, the bias voltage of the matrix was −80 V, the working gas was Ar, the flow of the gas was 30 sccm, the deposition temperature of the matrix was 120° C., the pressure was 1 Pa, the deposition time was 900 s, and the titanium transition layer with a thickness of about 150 nm was deposited on the surface of the matrix;

The sputtering current of the titanium target was 5.0 A, the bias voltage of the matrix was −80 V, the working gases were Ar and $N_2$, wherein the flow of the Ar gas was 30 sccm, the flow of the $N_2$ gas was 10 sccm, the deposition temperature of the matrix was 120° C., the pressure was 1 Pa, the deposition time was 3600 s, and the $TiN_x$ bearing layer with a thickness of about 220 nm was deposited on the surface of the matrix;

the sputtering current of the titanium target gradually decreased to 0 A while gradually increasing the sputtering current of the molybdenum disulfide target to 1.6 A, and the working gases were Ar and $N_2$, wherein the flow of the Ar gas was 16 sccm, the flow of the $N_2$ gas was 10 sccm, the bias voltage of the matrix was −50 V, the deposition temperature of the matrix was 80° C., the pressure was 1.0 Pa, the deposition time was 600 s, and the $TiN_x/MoS_2$ gradient transition layer with a thickness of about 100 nm was deposited on the surface of the $TiN_x$ bearing layer;

the sputtering current of the molybdenum disulfide target was maintained as 1.6 A while gradually increasing the sputtering current of Zn to 0.6 A, MoS2 and Zn were alternately deposited, the deposition time of the target in each period was 90 s, the total deposition time was 7000 s, and the $MoS_2$/Me ultra-lattice layer with a thickness of about 2 μm was deposited on the surface of the gradient transition layer.

The specific component parameters of the prepared $MoS_2$—Zn-4 composite coating sample are as shown in Table 1.

The following tests were performed on the $MoS_2$—Zn-4 composite coating prepared after the deposition treatment as described above.

The thickness of the coating was tested by using a scanning electron microscope.

The hardness and elastic modulus of the coating were measured using MTSNanoIndenterG200 nanoindentation system, with a diamond indenter and a depth of 1/10 of the film thickness at 200 nm. The average value of 6 points was taken. The test results are as shown in Table 2.

Binding force test: the binding force of the coating was tested by using an automatic scratch testing machine, which was operated according to the procedures of the automatic scratch testing machine. 3 scratch testes were conducted at different positions. The experimental conditions were as follows: the loading velocity was 5 N/min-10 N/min, the scratch length was 5 mm, and the loading force was 20 N. The test results are as shown in Table 2.

Friction and wear test: tribological performance analysis was conducted in a vacuum environment by using a CSM friction test machine. 9Cr18 steel balls were used as counterparts, a reciprocating sliding mode was adopted, the frequency was 5 Hz, the track length was 5 mm, the running distance was 720 m, and the normal loading was 5 N. The test results of friction coefficients and wear rates are as shown in Table 2.

Comparative Example 6

In this example, a matrix material was a 316L, TC4 or a single-crystal silicon wafer. A $MoS_2$—Zn-5 composite coating was prepared on the surface of a matrix by using an unbalanced magnetron sputtering technology. The main steps were as follows:

The surface of the matrix was mechanically polished, and the matrix material was ultrasonically cleaned in an acetone solution for 10 min, blown to be dry with nitrogen, then ultrasonically cleaned in an anhydrous ethanol solution for 10 min, and subsequently blown to be dry with nitrogen.

The cleaned matrix was put into an unbalanced magnetron sputtering cavity, the cavity was vacuumized until a vacuum degree was less than $1\times10^{-3}$ Pa, then the target was subjected to sputtering cleaning for 1200 s, and the temperature of the matrix was 50° C.-150° C. The $MoS_2$—Zn-5 composite coating was prepared and deposited by filling the cavity with high-pure argon, using a Ti target (with a purity of 99.99 at. %), a $MoS_2$ target (with a purity of 99.9 at. %)

and a Zn target for distributed control and adopting an unbalanced magnetron sputtering technology. The specific steps were as follows:

Plasma etching: a bias voltage of −500 V was applied to the matrix, the program running time was 1800 s, and the temperature of the matrix was 150° C.

The sputtering current of the titanium target was 5.0 A, the bias voltage of the matrix was −80 V, the working gas was Ar, the flow of the gas was 30 sccm, the deposition temperature of the matrix was 120° C., the pressure was 1 Pa, the deposition time was 900 s, and the titanium transition layer with a thickness of about 150 nm was deposited on the surface of the matrix;

The sputtering current of the titanium target was 5.0 A, the bias voltage of the matrix was −80 V, and the working gases were Ar and $N_2$, wherein the flow of Ar gas was 30 sccm, the flow of the $N_2$ gas was 10 sccm, the deposition temperature of the matrix was 120° C., the pressure was 1 Pa, the deposition time was 3600 s, and the $TiN_x$ bearing layer with a thickness of about 220 nm was deposited on the surface of the matrix;

the sputtering current of the titanium target gradually decreased to 0 A while gradually increasing the sputtering current of the molybdenum disulfide target to 1.6 A, and the working gases were Ar and $N_2$, wherein the flow of the Ar gas was 16 sccm, the flow of the $N_2$ gas was 10 sccm, the bias voltage of the matrix was −50 V, the deposition temperature of the matrix was 80° C., the pressure was 1.0 Pa, the deposition time was 600 s, and the $TiN_x/MoS_2$ gradient transition layer with a thickness of about 100 nm was deposited on the surface of the $TiN_x$ bearing layer;

the sputtering current of the titanium target was maintained as 1.6 A while gradually increasing the sputtering current of the Zn target to 0.6 A, the working gas was Ar, the flow of the gas was 16 sccm, the bias voltage of the matrix was −50 V, the deposition temperature of the matrix was 80° C., the pressure was 1.0 Pa, the deposition time was 600 s, and the $MoS_2/Zn$ gradient transition layer with a thickness of about 200 nm was deposited on the surface of the $TiN_x/MoS_2$ gradient transition layer;

The specific component parameters of the prepared $MoS_2$—Zn-5 composite coating sample are as shown in Table 1.

The following tests were performed on the $MoS_2$—Zn-5 composite coating prepared after the deposition treatment as described above.

The thickness of the coating was tested by using a scanning electron microscope.

The hardness and elastic modulus of the coating were measured using MTSNanoIndenterG200 nanoindentation system, with a diamond indenter and a depth of 1/10 of the film thickness at 200 nm. The average value of 6 points was taken. The test results are as shown in Table 2.

The binding force of the coating was tested by using an automatic scratch testing machine, which was operated according to the procedures of the automatic scratch testing machine. 3 scratch testes were conducted at different positions. The experimental conditions were as follows: the loading velocity was 5 N/min-10 N/min, the scratch length was 5 mm, and the loading force was 20 N. The test results are as shown in Table 2.

Friction and wear test: tribological performance analysis was conducted in a vacuum environment by using a CSM friction test machine. 9Cr18 steel balls were used as counterparts, a reciprocating sliding mode was adopted, the frequency was 5 Hz, the track length was 5 mm, the running distance was 720 m, and the normal loading was 5 N. The test results of friction coefficients and wear rates are as shown in Table 2.

The element component contents of 7 coatings in comparative examples 1-6 and examples 1-5 prepared through different metal targets and deposition time are as shown in Table 1, and the 7 coatings are named $MoS_2$, $MoS_2$—Zn-1, $MoS_2$—Zn-2, $MoS_2$—Zn-3, $MoS_2$—Zn-4, $MoS_2$—Zn-5, $TiN_x$—$MoS_2$/Zn-1, $TiN_x$—$MoS_2$/Zn-2, $TiN_x$—$MoS_2$/Zn-3, $TiN_x$—$MoS_2$/Ti, and $TiN_x$—$MoS_2$/Cr.

TABLE 1

Component parameters of 7 coating samples in examples and comparative examples

| Sample | Mo (at. %) | S (at. %) | Metal (at. %) | O (at. %) |
|---|---|---|---|---|
| $MoS_2$ | 37.7 | 56.3 | / | 6.0 |
| $MoS_2$—Zn-1 | 35.0 | 51.2 | 6.8 | 7.0 |
| $MoS_2$—Zn-2 | 30.8 | 50.7 | 11.1 | 7.4 |
| $MoS_2$—Zn-3 | 31.5 | 51.5 | 9.8 | 7.2 |
| $MoS_2$—Zn-4 | 31.9 | 51.2 | 8.5 | 8.4 |
| $MoS_2$—Zn-5 | 33.6 | 55.9 | 1.8 | 8.7 |
| $TiN_x$—$MoS_2$/Zn-1 | 30.8 | 50.1 | 10.7 | 8.4 |
| $TiN_x$—$MoS_2$/Zn-2 | 29.4 | 48.8 | 13.4 | 8.4 |
| $TiN_x$—$MoS_2$/Zn-3 | 30.6 | 50.7 | 10.5 | 8.2 |
| $TiN_x$—$MoS_2$/Ti | 34.5 | 50.4 | 8.6 | 6.5 |
| $TiN_x$—$MoS_2$/Cr | 32.5 | 51.7 | 8.2 | 7.6 |

It can be seen from Table 1 that the metal contents of the deposited coatings are 5.0%-15%, and the main body is molybdenum disulfide which meets the requirements on coatings with lubrication functions.

6 points with a depth of 200 nm were pressed into the surfaces of 7 coating samples in examples and comparative examples through a nanoindentation device to measure the hardness and elastic modulus. The results are as shown in Table 2 below. It can be seen from Table 2 that the hardness of 5 $TiN_x$—$MoS_2$/Me coatings in examples is no less than 7 GPa.

TABLE 2

Hardness, elastic modulus, binding forces, vacuum friction coefficients and wear rates of 11 coating samples in examples and comparative examples

| Sample | Hardness (GPa) | Elastic modulus (GPa) | Binding force (N) | Friction coefficient in vacuum environment | Wear rate in vacuum environment |
|---|---|---|---|---|---|
| $MoS_2$ | 3.5 | 55.4 | 6.7 | 0.043 | 4.95 |
| $MoS_2$—Zn-1 | 5.1 | 69.0 | 5.8 | 0.026 | 5.13 |
| $MoS_2$—Zn-2 | 5.8 | 72.0 | 6.2 | 0.015 | 3.78 |
| $MoS_2$—Zn-3 | 6.2 | 78.9 | 10.5 | 0.015 | 2.40 |
| $MoS_2$—Zn-4 | 6.6 | 80.2 | 12.6 | 0.013 | 3.41 |
| $MoS_2$—Zn-5 | 15.5 | 180.9 | 15.7 | 0.150 | 15.8 |
| $TiN_x$—$MoS_2$/Zn-1 | 7.3 | 97.5 | 14.2 | 0.011 | 1.50 |
| $TiN_x$—$MoS_2$/Zn-2 | 7.1 | 83.6 | 16.7 | 0.009 | 1.72 |
| $TiN_x$—$MoS_2$/Zn-3 | 7.9 | 102.0 | 18.5 | 0.007 | 0.97 |
| $TiN_x$—$MoS_2$/Ti | 7.4 | 95.6 | 17.9 | 0.007 | 1.02 |
| $TiN_x$—$MoS_2$/Cr | 8.1 | 101.8 | 18.4 | 0.009 | 1.42 |

$TiN_x$—$MoS_2$/Zn-3 in example 3 has optimal mechanical properties and tribological performance.

In conclusion, $TiN_x$—$MoS_2$/Me provided in the present application has good hardness (no less than 7 GPa) and other mechanical properties, a friction coefficient in a vacuum environment of up to 0.007 and a friction life of more than 4 million revolutions, and can meet the requirements on lubrication stability and long service life of the spatial mechanism.

In addition, the inventor of this case conducted tests according to the above-mentioned examples based on other raw materials, process operations and process conditions involved in the specification, and obtain ideal results.

It should be understood that the technical solution of the present application is not limited to the above specific embodiments, technical deformations made according to the technical solution of the present application without departing from the purpose of the present application and the protective scope of the appended claims are all included within the protective scope of the present application.

What is claimed is:

1. A preparation method of a low-friction long-life ultra-lattice composite coating, comprising:

by using an unbalanced magnetron sputtering technology based on a titanium target as a negative electrode target and an inert gas as a working gas, applying a sputtering current to the titanium target, and applying a back bias voltage to a matrix, thereby depositing a titanium transition layer on a surface of the matrix, wherein the sputtering current is 3.0 A-5.0 A, the back bias voltage of the matrix is −100 V to −150 V, a flow of the working gas is 20 sccm-30 sccm, a temperature of the matrix is 50° C.-150° C., a pressure of a reaction cavity is 0.1 Pa-2.0 Pa, and a deposition time is 300 s-900 s;

by using the unbalanced magnetron sputtering technology based on the titanium target as the negative electrode target and the inert gas and $N_2$ as the working gas, applying the sputtering current to the titanium target, and applying the back bias voltage to the matrix, thereby depositing a $TiN_x$ bearing layer on a surface of the titanium transition layer, wherein the sputtering current is 3.0 A-5.0 A, the back bias voltage of the matrix is −100 V to −150 V, a flow of the inert gas is 20 sccm-30 sccm, a flow of the N2 is 5 sccm-15 sccm, the temperature of the matrix is 50° C.-150° C., the pressure of the reaction cavity is 0.1 Pa-2.0 Pa, and the deposition time is 2400 s-4800 s;

by using the unbalanced magnetron sputtering technology based on the titanium target and a molybdenum disulfide target as electrode targets and the inert gas and the $N_2$ as the working gas, applying the sputtering current to the titanium target and the molybdenum disulfide target, and applying the back bias voltage to the matrix, thereby depositing a $TiN_x/MoS_2$ gradient transition layer on a surface of the $TiN_x$ bearing layer, wherein the sputtering current applied to the titanium target gradually decreases from 3.0 A-5.0 A to 0, the sputtering current applied to the molybdenum disulfide target gradually increases from 0 to 1.2 A-2.0 A, the back bias voltage of the matrix is −30 V to −70 V, the flow of the inert gas is 10 sccm-20 sccm, the flow of the N2 is 5 sccm-15 sccm, the temperature of the matrix is 50° C.-150° C., the pressure of the reaction cavity is 0.1 Pa-2.0 Pa, and the deposition time is 300 s-900 s;

by using the unbalanced magnetron sputtering technology based on a metal Me target and the molybdenum disulfide target as the electrode targets and the inert gas as the working gas, applying the sputtering current to the metal Me target and the molybdenum disulfide target, and applying the back bias voltage to the matrix, thereby depositing a $MoS_2/Me$ gradient transition layer on a surface of the $TiN_x/MoS_2$ gradient transition layer, wherein the sputtering current applied to the metal Me target gradually increases from 0 to 0.6 A-1.4 A, the sputtering current applied to the molybdenum disulfide target is 1.2 A-2.0 A, the back bias voltage of the matrix is −30 V to −70 V, the flow of the inert gas is 10 sccm-20 sccm, the temperature of the matrix is 50° C.-150° C., the pressure of the reaction cavity is 0.1 Pa-2.0 Pa, and the deposition time is 300 s-900 s;

and, by using the unbalanced magnetron sputtering technology based on the molybdenum disulfide target and the metal Me target as the electrode targets and the inert gas as the working gas, applying the back bias voltage to the matrix, applying the sputtering current to the molybdenum disulfide target and the metal Me target, and alternately depositing a $MoS_2$ layer and a Me layer, thereby depositing a $MoS_2/Me$ ultra-lattice layer on a surface of the $MoS_2/Me$ gradient transition layer, so as to obtain the low-friction long-life ultra-lattice composite coating, wherein the sputtering current applied to the molybdenum disulfide target is 1.2 A-2.0 A, the sputtering current applied to the metal Me target is 0.6 A-1.4 A, the back bias voltage of the matrix is −30 V to −70 V, a flow of the working gas is 10 sccm-20 sccm, the temperature of the matrix is 50° C.-150° C., the pressure of the reaction cavity is 0.1 Pa-2.0 Pa, and the deposition time is 6000 s-8000 s; the deposition time for alternately depositing the $MoS_2$ layer and the Me layer in each period is 10 s-90 s;

the low-friction long-life ultra-lattice composite coating comprising: the titanium transition layer, the $TiN_x$ bearing layer, the $TiN_x/MoS_2$ gradient transition layer, the $MoS_2/Me$ gradient transition layer, and the $MoS_2/Me$ ultra-lattice layer which are successively formed on the surface of the matrix; wherein, x is 0.5-1, Me is selected from a combination of any one or more than two of Ti, Zr, V, Nb, Cr, Mo, and Cd; furthermore, in a direction gradually far away from the matrix, a content of $MoS_2$ in the $TiN_x/MoS_2$ gradient transition layer is increasing, and a content of $MoS_2$ in the $MoS_2/Me$ gradient transition layer is decreasing; the $MoS_2/Me$ ultra-lattice layer comprises a plurality of alternately stacked periodic layers, and each alternately stacked periodic layer comprises one $MoS_2$ layer and one Me layer; the $MoS_2$ layer in the $MoS_2/Me$ ultra-lattice layer is oriented and grows parallel to a $MoS_2$ (002) plane; a friction coefficient of the low-friction long-life ultra-lattice composite coating in a vacuum environment is less than 0.02, and a wear life of the low-friction long-life ultra-lattice composite coating is more than $4\times10^6$ revolutions.

2. The preparation method according to claim 1, further comprising: vacuumizing the reaction cavity until a vacuum degree is less than $3.0\times10^{-5}$ torr, and performing a plasma etching on a washed matrix.

3. The preparation method according to claim 1, wherein the matrix comprises a spatial mechanism.

4. A low-friction long-life ultra-lattice composite coating prepared by the preparation method according to claim 1.

5. The low-friction long-life ultra-lattice composite coating according to claim 4, wherein a hardness of the low-friction long-life ultra-lattice composite coating is more than 7 GPa.

6. The low-friction long-life ultra-lattice composite coating according to claim 4, wherein a binding force between the low-friction long-life ultra-lattice composite coating and the matrix is more than 15 N, a material of the matrix is selected from 316L stainless steel, a TC4 titanium alloy, or a monocrystalline silicon wafer.

7. The low-friction long-life ultra-lattice composite coating according to claim 4, wherein a thickness of the titanium transition layer is 50 nm-150 nm.

8. The low-friction long-life ultra-lattice composite coating according to claim 4, wherein a thickness of the $TiN_x$ bearing layer is 150 nm-300 nm; a thickness of the $TiN_x$/$MoS_2$ gradient transition layer is 50 nm-150 nm; a thickness of the $MoS_2$/Me gradient transition layer is 100 nm-300 nm; a thickness of the $MoS_2$/Me ultra-lattice layer is 1.5 μm-2.5 μm; and a thickness of the low-friction long-life ultra-lattice composite coating is 2.0 μm-3.0 μm.

9. The low-friction long-life ultra-lattice composite coating according to claim 4, wherein a $MoS_2$-to-Me modulation ratio $t_{MoS2}:t_{Me}$ in the $MoS_2$/Me ultra-lattice layer is (5:1)-(2:1).

10. The low-friction long-life ultra-lattice composite coating according to claim 4, wherein a modulation period of the $MoS_2$/Me ultra-lattice layer is $\Lambda$=4 nm-20 nm.

11. The low-friction long-life ultra-lattice composite coating according to claim 4, wherein a content of metal atoms in the $MoS_2$/Me ultra-lattice layer is 5 at %-15 at %.

12. A use of the low-friction long-life ultra-lattice composite coating according to claim 4 in a surface protection field of a spatial mechanism.

13. The low-friction long-life ultra-lattice composite coating according to claim 4, wherein the preparation method further comprises: vacuumizing the reaction cavity until a vacuum degree is less than $3.0 \times 10^{-5}$ torr, and performing a plasma etching on a washed matrix.

14. The low-friction long-life ultra-lattice composite coating according to claim 4, wherein in the preparation method, the matrix comprises a spatial mechanism.

15. The low-friction long-life ultra-lattice composite coating according to claim 13, wherein a hardness of the low-friction long-life ultra-lattice composite coating is more than 7 GPa.

16. The low-friction long-life ultra-lattice composite coating according to claim 13, wherein a binding force between the low-friction long-life ultra-lattice composite coating and the matrix is more than 15 N, a material of the matrix is selected from 316L stainless steel, a TC4 titanium alloy, or a monocrystalline silicon wafer.

17. The low-friction long-life ultra-lattice composite coating according to claim 13, wherein a thickness of the titanium transition layer is 50 nm-150 nm.

18. The low-friction long-life ultra-lattice composite coating according to claim 13, wherein a thickness of the $TiN_x$ bearing layer is 150 nm-300 nm; a thickness of the $TiN_x$/$MoS_2$ gradient transition layer is 50 nm-150 nm; a thickness of the $MoS_2$/Me gradient transition layer is 100 nm-300 nm; a thickness of the $MoS_2$/Me ultra-lattice layer is 1.5 μm-2.5 μm; and a thickness of the low-friction long-life ultra-lattice composite coating is 2.0 μm-3.0 μm.

19. The low-friction long-life ultra-lattice composite coating according to claim 13, wherein a $MoS_2$-to-Me modulation ratio $t_{MoS2}:t_{Me}$ in the $MoS_2$/Me ultra-lattice layer is (5:1)-(2:1).

20. The low-friction long-life ultra-lattice composite coating according to claim 13, wherein a modulation period of the $MoS_2$/Me ultra-lattice layer is $\Lambda$=4 nm-20 nm.

* * * * *